United States Patent
Dairiki et al.

(10) Patent No.: US 11,728,356 B2
(45) Date of Patent: Aug. 15, 2023

(54) PHOTOELECTRIC CONVERSION ELEMENT AND IMAGING DEVICE

(71) Applicant: Semiconductor Energy Laboratory Co., Ltd., Atsugi (JP)

(72) Inventors: Koji Dairiki, Ayabe (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1798 days.

(21) Appl. No.: 15/149,469

(22) Filed: May 9, 2016

(65) Prior Publication Data

US 2016/0336363 A1 Nov. 17, 2016

(30) Foreign Application Priority Data

May 14, 2015 (JP) .................................. 2015-099011

(51) Int. Cl.
*H01L 27/146* (2006.01)
*H01L 31/0272* (2006.01)
(Continued)

(52) U.S. Cl.
CPC .. *H01L 27/14607* (2013.01); *H01L 27/14609* (2013.01); *H01L 27/14665* (2013.01);
(Continued)

(58) Field of Classification Search
CPC ....... H01L 27/146; H01L 29/78; H01L 31/02; H01L 2224/48091; H01L 2924/12044;
(Continued)

(56) References Cited

U.S. PATENT DOCUMENTS

| | | |
|---|---|---|
| 4,860,076 A | 8/1989 | Tabei et al. |
| 5,198,673 A | 3/1993 | Rougeot et al. |

(Continued)

FOREIGN PATENT DOCUMENTS

| | | |
|---|---|---|
| CN | 103945136 A | 7/2014 |
| EP | 1737044 A | 12/2006 |

(Continued)

OTHER PUBLICATIONS

Abbaszadeh et al., "Enhanced dark current suppression of amorphous selenium detector with use of IGZO hole blocking layer", IEEE Trans. Elec. Dev. vol. 61, No. 9, p. 3355-3357 (Year: 2014).*

(Continued)

*Primary Examiner* — Meiya Li
(74) *Attorney, Agent, or Firm* — Robinson Intellectual Property Law Office; Eric J. Robinson

(57) ABSTRACT

A photoelectric conversion element includes a first electrode, a second electrode, a first layer, and a second layer. The first layer is provided between the first electrode and the second electrode. The second layer is provided between the first layer and the second electrode. The first layer contains selenium. The second layer contains In, Ga, Zn, and O. The second layer may contain an In—Ga—Zn oxide. The selenium may be crystalline selenium. The first layer functions as a photoelectric conversion layer. The second layer functions as a hole injection blocking layer. The In—Ga—Zn oxide may have a c-axis aligned crystal.

18 Claims, 22 Drawing Sheets

(51) Int. Cl.
 H01L 31/0224 (2006.01)
 H01L 29/04 (2006.01)
 H01L 29/786 (2006.01)
(52) U.S. Cl.
 CPC ........ *H01L 27/14692* (2013.01); *H01L 29/04* (2013.01); *H01L 29/7869* (2013.01); *H01L 31/0224* (2013.01); *H01L 31/0272* (2013.01); H01L 27/14627 (2013.01); H01L 27/14636 (2013.01)
(58) Field of Classification Search
 CPC ............. H01L 27/2409; H01L 27/2436; H01L 27/2463; H01L 2924/00; H01L 2924/00014; H01L 45/06; H01L 45/065; H01L 45/1233; H01L 45/141; H01L 45/143; H01L 45/144; H01L 27/283; H01L 21/8221; H01L 2223/6677; H01L 2224/48137; H01L 2224/49107; H01L 2224/73265; H01L 23/66; H01L 27/0688; H01L 27/1266; H01L 45/1213; H01L 45/14; H01L 51/0098; H01L 27/14607; H01L 27/14627; H01L 27/14636; H01L 27/14665; H01L 31/0224; H01L 31/0272; H01L 31/109; H01L 27/14612; H01L 27/14621; H01L 27/14647; H01L 27/14694; H01L 27/14696; H01L 31/022475; H01L 31/0296; H01L 31/032; H01L 27/10; H01L 27/12; H01L 27/1207; H01L 27/1225; H01L 27/14609; H01L 27/14692; H01L 27/28; H01L 29/04; H01L 29/78645; H01L 29/7869; H01L 51/0059
 USPC ...................................... 257/40–48
 See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,046,282 | B1 | 5/2006 | Zhang et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito |
| 7,674,650 | B2 | 3/2010 | Akimoto et al. |
| 7,732,819 | B2 | 6/2010 | Akimoto et al. |
| 8,071,980 | B2 | 12/2011 | Iwazaki |
| 8,378,391 | B2 | 2/2013 | Koyama et al. |
| 8,424,764 | B2 | 4/2013 | Tanaka et al. |
| 8,916,869 | B2 | 12/2014 | Koyama et al. |
| 9,000,541 | B2 | 4/2015 | Hattori et al. |
| 9,236,408 | B2 | 1/2016 | Yamazaki |
| 9,331,122 | B2 | 5/2016 | Koyama et al. |
| 9,590,110 | B2 | 3/2017 | Osada |

| | | | |
|---|---|---|---|
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0224162 | A1 | 9/2009 | Inuiya et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0276003 | A1* | 11/2010 | Kawano ................ B82Y 30/00 136/261 |
| 2010/0307558 | A1 | 12/2010 | Yamazaki et al. |
| 2012/0075478 | A1* | 3/2012 | Ahn ....................... H04N 5/361 348/164 |

(56) References Cited

U.S. PATENT DOCUMENTS

| | | | | |
|---|---|---|---|---|
| 2012/0257191 | A1* | 10/2012 | Deckenbach | A61B 5/1172 356/71 |
| 2012/0318959 | A1* | 12/2012 | Yamaguchi | H01L 27/14636 250/208.1 |
| 2013/0016035 | A1 | 1/2013 | Ikeda | |
| 2013/0222584 | A1 | 8/2013 | Aoki et al. | |
| 2013/0285046 | A1* | 10/2013 | Yamazaki | H01L 27/14603 257/43 |
| 2015/0195462 | A1* | 7/2015 | Kano | H04N 5/361 386/328 |
| 2015/0325660 | A1* | 11/2015 | Hitora | H01L 29/7722 257/43 |
| 2016/0021319 | A1* | 1/2016 | Okamoto | H01L 27/14612 250/201.1 |

FOREIGN PATENT DOCUMENTS

| | | |
|---|---|---|
| EP | 2226847 A | 9/2010 |
| EP | 2490264 A | 8/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-318380 A | 11/2003 |
| JP | 2004-103957 A | 4/2004 |
| JP | 2004-273614 A | 9/2004 |
| JP | 2004-273732 A | 9/2004 |
| JP | 2008-251999 A | 10/2008 |
| JP | 2012-169517 A | 9/2012 |
| JP | 2014-017440 | 1/2014 |
| JP | 2014017440 A * | 1/2014 |
| JP | 2014-120616 A | 6/2014 |
| JP | 2015-079944 A | 4/2015 |
| WO | WO-2004/114391 | 12/2004 |

OTHER PUBLICATIONS

Lynch et al., "Characterization of reactively sputtered c-axis aligned nanocrystalline InGaZO4", APL 105, 262103 (Year: 2014).*

Imura et al., "high sensitivity image sensor overlaid with thin-film crystalline-selenium-based heterojunction photodiode", IEDM Tech. Dig. pp. 4.3.1-4.3.4 (Year: 2014).*

Ryohei Funatsu et al., "Development of 133Mpixel 60fps CMOS Image Sensor using 32-Column Shared High-Speed SAR ADCs", ITE Technical Report, vol. 39, No. 16, Mar. 27, 2015, pp. 53-56.

Ryohei Funatsu et al., "133Mpixel 60fps CMOS Image Sensor with 32-Column Shared High-Speed Column-Parallel SAR ADCs", ISSCC 2015 (Digest of Technical Papers. IEEE International Solid-State Circuits Conference), Feb. 23, 2015, pp. 112-113.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al. "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al. "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al. "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al. "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest'08 : SID International Symposium Digest of Technical Papers, May 20, 2008, vol. 39, pp. 621-624.

Hirao.T et al., "Novel Top-Gate Zinc Oxide Thin-Film Transistors (ZNO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al. "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects In ZnO", Phys. Rev. B (Physical Review. B), Oct. 4, 2007, vol. 76, No. 16, pp. 165202-1-165202-22.

Janotti.A et al. "Oxygen Vacancies In ZnO", Appl. Phys. Lett. (Applied Physics Letters) , 2005, vol. 87, pp. 122102-1-122102-3.

Jeong.J et al., "3.1: Distinguished Paper: 12.1-lnch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

(56) References Cited

OTHER PUBLICATIONS

Kikuchi.H et al., "62.2:Invited Paper:Fast Electro-Optical Switching in Polymer-Stabilized Liquid Crystalline Blue Phases for Display Application", SID Digest'07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the In2O3 and SC2O3—A2O3—BO Systems [A; Fe, Ga, or Al; B: Mg, Mn, Fe, Nl, Cu, or Zn] at Temperatures Over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al. "Current Status of, Challenges to, and Perspective View of AM-OLED ", IDW'06 : Proceedings of the 13th International Display Workshops, Dec. 7, 2006, pp. 663-666.

Lee. J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID DIGEST'07 : SID International Symposium Digest of Technical Papers, 2007, vol. 38, pp. 1673-1676.

Mo.Y et al., "Amorphous Oxide TFT Backplanes for Large Size AMOLED Displays", IDW'08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD'09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al. "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZNO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al. "Development of 4.0-In. AMOLED Display With Driver Circuit Using Amorphous In—Ga—Zn-Oxide TFTs", IDW'09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO

(56) References Cited

OTHER PUBLICATIONS (Ga2O3—In2O3—Zn0) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW'08 : Proceedings of the 15th International Display Workshops, Dec. 3,, 2008, pp. 1637-1640.

Tsuda.K et al., "Ultra Low Power Consumption Technologies for Mobile TFT-LCDs ", IDW'02 : Proceedings of the 9th International Display Workshops, Dec. 4, 2002, pp. 295-298.

Ueno.K et al., "Field-Effect Transistor on SrTiOS With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 14A1
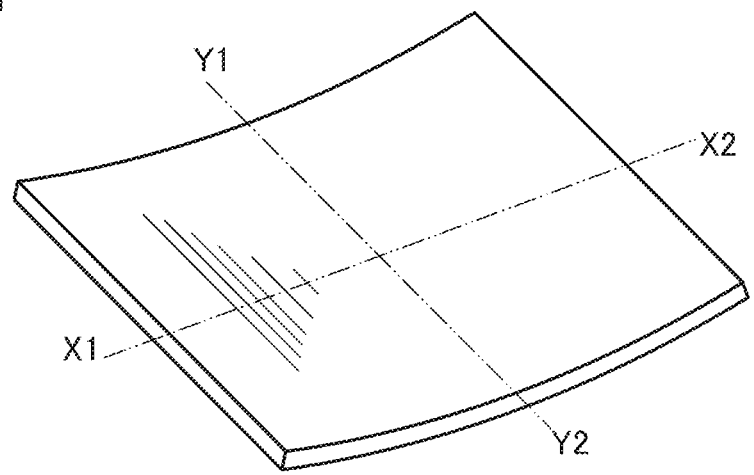
FIG. 14A2
FIG. 14A3
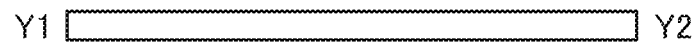
FIG. 14B1
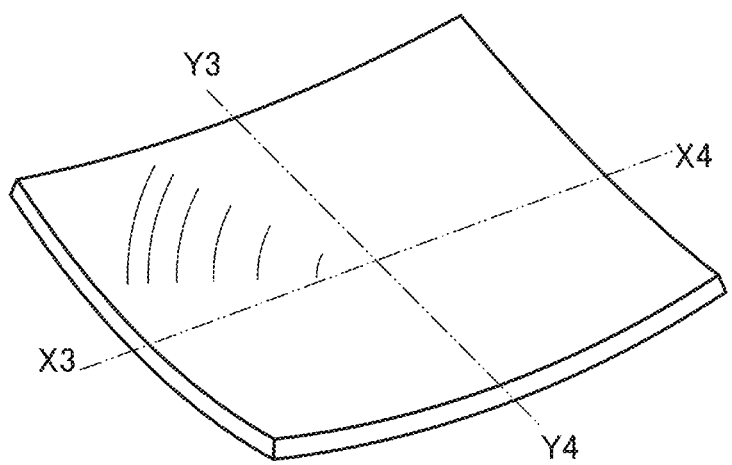
FIG. 14B2
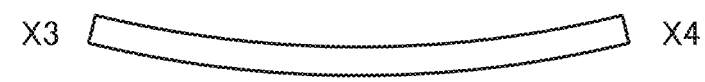
FIG. 14B3

PHOTOELECTRIC CONVERSION ELEMENT AND IMAGING DEVICE

BACKGROUND OF THE INVENTION

1. Field of the Invention

One embodiment of the present invention relates to a photoelectric conversion element and an imaging device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, an imaging device, or an electronic device includes a semiconductor device.

2. Description of the Related Art

In recent years, so-called 4K or 8K broadcasting with higher resolution (a larger number of the pixels) for showing an image or a moving image than 1080i (2K), which is the conventional HD television broadcasting, is being considered. In particular, 8K broadcasting is expected to show images with a sense of reality, a three-dimensional effect, or an immersion effect that have not been able to be experienced by the conventional images; thus, it is highly expected that a revolutionary image experience will be given to the viewers. Note that there are many challenges to be solved such as technology and cost for achieving 4K/8K broadcasting. For example, an imaging device capable of shooting 8K images, a cable which transmits 8K video signals, a tuner included in a display device which receives 8K video signals, a display device capable of displaying 8K images, and the like are needed; however, they are all being developed.

Various devices as described above for the resolution of so-called full high definition using pixels arranged in 1920× 1080 (also referred to as "2K resolution," "2K1K," "2K," and the like) have already been achieved. However, with regard to the resolution of so-called ultra full high definition using pixels arranged in 3840×2160 or in 4096×2160 (also referred to as "4K resolution," "4K2K," "4K," and the like), 4K television broadcasting has not already been provided on a full scale, whereas the display devices began to be sold. Furthermore, with regard to the resolution of so-called super high definition using pixels arranged in 7680×4320 or in 8192×4320 (also referred to as "8K resolution," "8K4K," "8K," and the like), technology development, in any of producing, transmitting, and displaying of the video signals, for reaching the practical use level is awaited. Once 8K television broadcasting is provided, there is an additional possibility of taking 16K and 32K resolution into consideration.

In such a situation, the development of a CMOS sensor having 133,000,000 pixels for a high resolution camera capable of producing 8K images was reported (see Non-Patent Document 1). In order to fabricate such a high resolution sensor, highly integrated array of pixels is required. High integration of pixels needs reduction in area per pixel.

In the case where the area of a pixel is reduced, the light-receiving area of a photoelectric conversion element included in the pixel also needs to be reduced. When the light-receiving area of the photoelectric conversion element is reduced, it might be difficult to perform imaging under a low illuminance condition because of the decrease in sensitivity to light.

In order to solve such a problem, a photoelectric conversion element utilizing avalanche charge multiplication can be effectively used. However, such a photoelectric conversion element has a relatively large dark current, which might cause deterioration in imaging quality. As a countermeasure, an image sensor in which a dark current can be reduced has been disclosed (see Patent Document 1).

REFERENCE

Patent Document

[Patent Document 1] Japanese Published Patent Application No. 2014-17440

Non-Patent Document

[Non-Patent Document 1] *ITE Technical Report*, Vol. 39, No. 16, pp. 53-56, given on Mar. 27, 2015.

[Non-Patent Document 2] R. Funatsu et al., "133 Mpixel 60 fps CMOS Image Sensor with 32-Column Shared High-Speed Column-Parallel SAR ADCs," *IEEE ISSCC, Dig. Tech. Papers,* 2015

Patent Document 1 discloses a photoelectric conversion element in which a hole injection blocking layer formed using a gallium oxide is stacked over a photoelectric conversion layer as one of the components. A photoelectric conversion element including a chalcopyrite semiconductor for a photoelectric conversion layer has a large dark current at the time of electric field application. One of the factors in the dark current is thought to be insufficient suppression of charge injection into the chalcopyrite semiconductor from an electrode. Then, a hole injection blocking layer formed using a gallium oxide is stacked over a photoelectric conversion layer, whereby charge injection can be suppressed and the dark current can be reduced.

However, the provision of the hole injection blocking layer formed using a gallium oxide in the photoelectric conversion element brings following problems in some cases.

First, a particle-like gallium oxide might be generated in a deposition apparatus when a gallium oxide is formed by a vacuum evaporation method, a sputtering method, a pulsed laser deposition method, or the like, for example. A particle-like gallium oxide taken into the photoelectric conversion element acts as a foreign substance in the element, and some pixels cannot function correctly in some cases. In particular, a photoelectric conversion element used for shooting 8K resolution images consists of numerous pixels, and each pixel is formed extremely small; therefore, the problem of the foreign substance has a considerable influence. In addition, the problem directly influences a fabrication yield of the imaging device.

Second, it is known that a gallium oxide layer formed by a vacuum evaporation method, a sputtering method, a pulsed laser deposition method, or the like has low crystallinity. When a semiconductor having a chalcopyrite crystal is used for a photoelectric conversion layer included in a photoelectric conversion element, for example, low crystallinity of the hole injection blocking layer in contact with the photoelectric conversion layer reduces adhesion at the interface between the layers, so that damages or separation causes at the interface in some cases. Specifically in the photoelectric conversion element used for shooting 8K resolution images, each of the pixels is formed extremely small; therefore, the problem has a considerable influence.

The above problems arise not necessarily only when an imaging element includes pixels of high resolution such as 8K, but also when an imaging element includes pixels of 4K resolution or lower. There are other objects which will be apparent, in due course, from the description of the specification, the drawings, the claims, and the like.

SUMMARY OF THE INVENTION

In view of the above, an object of one embodiment of the present invention is to provide an imaging device with excellent imaging performance. Another object is to provide an imaging device that easily performs imaging under a low illuminance condition. Another object is to provide a low power consumption imaging device. Another object is to provide an imaging device that is suitable for high-speed operation. Another object is to provide a high resolution imaging device. Another object is to provide an imaging device with small variations in characteristics between its pixels. Another object is to provide a highly integrated imaging device. Another object is to provide an imaging device which can be used in a wide temperature range. Another object is to provide an imaging device with a high aperture ratio. Another object is to provide an imaging device with high reliability. Another object is to provide a novel imaging device or the like. Another object is to provide a novel semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a photoelectric conversion element which includes a first electrode, a second electrode, a first layer, and a second layer. The first layer is provided between the first electrode and the second electrode, the second layer is provided between the first layer and the second electrode, the first layer contains selenium, and the second layer contains In, Ga, Zn, and O.

Note that one embodiment of the present invention may be a photoelectric conversion element in which the second layer contains an In—Ga—Zn oxide. The In—Ga—Zn oxide may be an oxide having a CAAC structure. The selenium may be crystalline selenium. The first layer may function as a photoelectric conversion layer, and the second layer may function as a hole injection blocking layer. The photoelectric conversion element may further include a third layer between the first layer and the first electrode, and the third layer may function as an electron injection blocking layer. The third layer may contain nickel oxide or antimony sulfide. The second electrode may contain In, Sn, and O. The second electrode may contain indium tin oxide (ITO).

Another embodiment of the present invention is a photoelectric conversion element which includes a first electrode, a first layer over the first electrode, a second layer over the first layer, and a second electrode over the second layer. The first layer contains selenium, and the second layer contains In, Ga, Zn, and O.

Another embodiment of the present invention is a photoelectric conversion element which includes a first electrode, a first layer over the first electrode, a second layer over the first layer, and a second electrode over the second layer. The first layer contains selenium and functions as a photoelectric conversion layer. The second layer contains In, Ga, Zn, and O, and functions as a hole injection blocking layer.

Note that one embodiment of the present invention may be a photoelectric conversion element in which the second layer contains an In—Ga—Zn oxide. One embodiment of the present invention may be a photoelectric conversion element in which the In—Ga—Zn oxide is an oxide having a CAAC structure. In one embodiment of the present invention, the selenium may be crystalline selenium. The photoelectric conversion element may further include a third layer between the first electrode and the second layer, and the third layer may contain nickel oxide or antimony sulfide. The photoelectric conversion element may further include a third layer between the first electrode and the second layer, and the third layer may function as an electron injection blocking layer. The second electrode may contain In, Sn, and O. The second electrode may contain an indium tin oxide.

Another embodiment of the present invention is an imaging device which includes the photoelectric conversion element of one embodiment of the present invention and a driver transistor electrically connected to the photoelectric conversion element. One embodiment of the present invention may be an imaging device which further includes a microlens array or a diffraction grating and a color filter and in which the photoelectric conversion element is capable of receiving the light passing through the microlens array or the diffraction grating and the color filter. The driver transistor may contain an oxide semiconductor. The imaging device may include a larger number of the photoelectric conversion elements than or equal to the number of photoelectric conversion elements used for shooting 8K resolution images and may be capable of producing a video signal with 8K resolution.

According to one embodiment of the present invention, an imaging device with excellent imaging performance can be provided. An imaging device that easily performs imaging under a low illuminance condition can be provided. A low power consumption imaging device can be provided. An imaging device that is suitable for high-speed operation can be provided. A high resolution imaging device can be provided. An imaging device with small variations in characteristics between its pixels can be provided. A highly integrated imaging device can be provided. An imaging device which can be used in a wide temperature range can be provided. An imaging device with a high aperture ratio can be provided. An imaging device with high reliability can be provided. A novel imaging device or the like can be provided. A novel semiconductor device or the like can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF THE DRAWINGS

In the accompanying drawings:

FIGS. 14A1, 14A2, 14A3, 14B1, 14B2, and 14B3 illustrate a bent imaging device;

DETAILED DESCRIPTION OF THE INVENTION

Figure 1A:
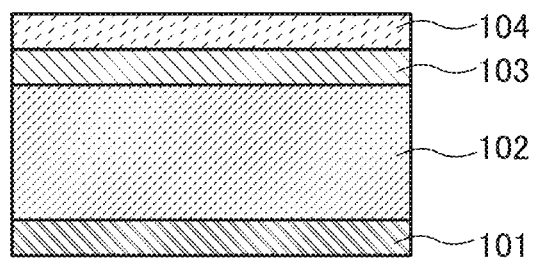
FIGS. 1A and 1B are cross-sectional views each illustrating a structure of a photoelectric conversion element.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of Embodiments below. Note that in structures of the present invention described below, the same portions or portions having similar functions are denoted by the same reference numerals in different drawings, and description thereof is not repeated in some cases. It is also to be noted that the same components are denoted by different hatching patterns in different drawings, or the hatching patterns are omitted in some cases.

Note that the terms "film" and "layer" can be interchanged with each other depending on circumstances or conditions. For example, the term "conductive layer" can be changed into the term "conductive film" in some cases. In addition, the term "insulating film" can be changed into the term "insulating layer" in some cases.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

In this embodiment, a photoelectric conversion element 100 of one embodiment of the present invention will be described with reference to drawings.

FIG. 1A schematically illustrates a cross-sectional structure of the photoelectric conversion element 100 of one embodiment of the present invention. The photoelectric conversion element 100 includes a first electrode 101, a photoelectric conversion layer 102 over the first electrode 101, a hole injection blocking layer 103 over the photoelectric conversion layer 102, and a second electrode 104 over the hole injection blocking layer 103.

The photoelectric conversion element 100 may be formed over a substrate or over a driver transistor which is formed in a substrate or formed over a substrate.

Figure 1B:
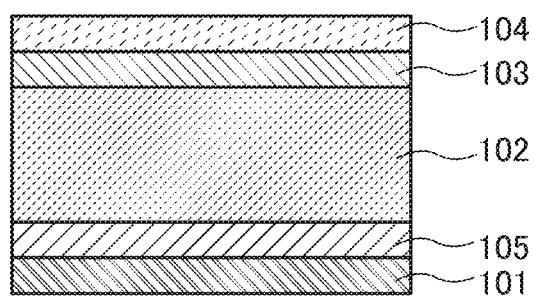

FIG. 1B schematically illustrates a cross-sectional structure of the photoelectric conversion element 100 of another embodiment of the present invention. The photoelectric conversion element 100 includes the first electrode 101, an electron injection blocking layer 105 over the first electrode 101, the photoelectric conversion layer 102 over the electron injection blocking layer 105, the hole injection blocking layer 103 over the photoelectric conversion layer 102, and the second electrode 104 over the hole injection blocking layer 103.

<First Electrode 101>

The first electrode 101 is used as a negative electrode, for example. The first electrode 101 can be formed using gold, titanium nitride, molybdenum, tungsten, or the like, for example. Alternatively, aluminum, titanium, or a stack of titanium, aluminum, and titanium that are layered in that order can be used. The first electrode 101 can be formed by a sputtering method or a plasma CVD method.

The first electrode 101 illustrated in FIG. 1A preferably has a high flatness in order to prevent a short circuit with the second electrode 104 caused by, for example, poor coverage with the photoelectric conversion layer 102.

As an example of a conductive film having high planarity, an indium tin oxide film containing silicon at 1 wt % to 20 wt % can be given. The high planarity of an indium tin oxide film containing silicon has been confirmed by the measurement with an atomic force microscope. A region of 2 μm×2 μm in an indium tin oxide film which has been subjected to heat treatment at 350° C. for 1 hour and a region of 2 μm×2 μm in an indium tin oxide film containing silicon at 10 wt % which has been subjected to the same heat treatment were observed with an atomic force microscope; the peak-to-valley height (P-V) of the former was 23.3 nm, and that of the latter was 7.9 nm.

Since the indium tin oxide film is crystallized at a relatively low temperature even when it is amorphous at the time of its deposition, surface roughness due to the growth of crystal grains is easily caused. In contrast, when the indium tin oxide film containing silicon is analyzed by an X-ray diffraction, a peak does not appear even in the case where the film has been subjected to heat treatment at a temperature higher than 400° C. In other words, the indium tin oxide film containing silicon keeps its amorphous state even after heat treatment at a relatively high temperature. Therefore, the surface roughness of the indium tin oxide film containing silicon is less likely to occur.

<Photoelectric Conversion Layer 102>

Next, the photoelectric conversion layer 102 will be described. A selenium-based material can be used for the photoelectric conversion layer 102. The photoelectric conversion element 100 including a selenium-based material has high external quantum efficiency with respect to visible light. Such a photoelectric conversion element can be a highly sensitive sensor in which the amount of amplification of electrons with respect to the amount of incident light is large because of an avalanche phenomenon. Furthermore, the selenium-based material has a high light-absorption coefficient, which leads to an advantage that the photoelectric conversion layer 102 can be formed thin easily.

Examples of the selenium-based material are single-crystal selenium and non-single-crystal selenium. Examples of the non-single-crystal selenium include polycrystalline selenium, microcrystalline selenium, and amorphous selenium. Such selenium can be used for the photoelectric conversion layer 102. Furthermore, a mixed selenium layer including crystalline selenium and amorphous selenium may be used. A crystalline selenium layer can be obtained by, for example, depositing an amorphous selenium layer and then performing heat treatment. Note that when the crystal grain size of the selenium included in a crystalline selenium layer used for the photoelectric conversion layer 102 is smaller than a pixel pitch, variations in characteristics between pixels can be reduced. Moreover, a crystalline selenium layer has higher spectral sensitivity to and a higher absorption coefficient for visible light than an amorphous selenium layer. Note that an amorphous selenium layer can also be used.

Furthermore, the photoelectric conversion layer 102 may be a layer including a compound of copper, indium, and selenium (CIS). Alternatively, a layer including a compound of copper, indium, gallium, and selenium (CIGS) may be used. A photoelectric conversion element including the CIS layer or the CIGS layer can also utilize an avalanche phenomenon like the photoelectric conversion element including selenium alone. CIS and CIGS are p-type semiconductors and may be formed in contact with an n-type semiconductor such as cadmium sulfide or zinc sulfide to form a junction. It is preferable to apply a relatively high voltage (e.g., 10 V or higher) to the photoelectric conversion element in order to cause the avalanche phenomenon.

<Hole Injection Blocking Layer 103>

Next, the hole injection blocking layer 103 of one embodiment of the present invention will be described. The hole injection blocking layer 103 is a layer which suppresses hole injection into the photoelectric conversion layer 102 from the second electrode 104.

The conventional problem is that the photoelectric conversion element in which the above selenium-based material is used for the photoelectric conversion layer has a low signal-noise (S/N) ratio because of its large dark current at the time of electric field application. One of causes of the dark current is that charge injection into the photoelectric conversion layer from the electrode was not able to be suppressed. Then, a structure was proposed in which a hole injection blocking layer formed using gallium oxide is provided between the photoelectric conversion layer and the electrode so that charge injection into the photoelectric conversion layer is suppressed.

Here, a tunnel current flowing through the hole injection blocking layer needs to be prevented so that the gallium oxide layer is efficiently utilized as the hole injection blocking layer; therefore, the layer needs to be greater than or equal to a certain thickness. The thickness is preferably set to be greater than or equal to 5 nm and less than or equal to 1 μm, and further preferably greater than or equal to 10 nm and less than or equal to 500 nm.

When the gallium oxide layer is formed, particle-like foreign substances containing gallium oxide as its main component are generated in no small quantities.

The measurement results of the number of particles generated when a gallium oxide layer having a thickness of 5 nm is formed by a metal organic chemical vapor deposition (MOCVD) method will be described here.

First, the measurement will be briefly described. A 5-inch-square glass substrate was prepared, and then the number of particles on the substrate was counted with a glass substrate inspecting apparatus. Next, the substrate was loaded to the MOCVD apparatus, gallium oxide is deposited to have a thickness of 5-nm, and the substrate was taken from the apparatus. Then, the number of particles on the substrate was counted again with the glass substrate inspecting apparatus. Finally, an increase in the number of particles after the deposition as compared with before the deposition was counted.

The measurement conditions will be described in detail. The number of particles having a diameter of 1 μm and greater on the glass substrate was counted by the use of "GI4600" manufactured by Hitachi High-Technologies Corporation as the glass substrate inspecting apparatus. As the MOCVD apparatus, "WMCHH-2127s" manufactured by WACOM R&D Corporation was used. As source gases, triethylgallium (TEG) was used at a supplied amount of 0.1 ccm; ethylcyclohexane (ECH), 0.5 ccm; and oxygen, 2.0 slm. Furthermore, argon was used at a supplied amount of 1.8 slm as a carrier gas, and nitrogen was used at a supplied amount of 0.38 slm as a purge gas. The substrate temperature was 475° C. and the pressure in the apparatus was 1067 Pa at the time of the deposition.

Three glass substrates were subjected to the deposition. Increases in the number of particles after the deposition as compared with before the deposition were 9, 3, and 25. The number of particles generated at the time of the deposition of a 5-nm gallium oxide layer was counted by this measurement, and the number of particles should further increase if the layer is thicker.

The particles taken into the photoelectric conversion element act as foreign substances in the element, and some pixels cannot function correctly in some cases. In particular, a photoelectric conversion element used for shooting 8K resolution images consists of numerous pixels; therefore, each pixel is formed extremely small. For example, when the size of one pixel is a 3 µm×3 µm square, a 1-µm particle formed in the deposition apparatus taken into the photoelectric conversion element is an extremely big problem. The problem directly influences a fabrication yield of the imaging device.

In addition, it is known that a gallium oxide layer has low crystallinity. When a crystalline selenium-based material is used for a photoelectric conversion layer included in a photoelectric conversion element, for example, low crystallinity of the hole injection blocking layer, which is in contact with the photoelectric conversion layer, weakens adhesion at the interface between the photoelectric conversion layer and the hole injection blocking layer, so that damages or separation causes at the interface in some cases. In addition, movement of charges between the layers is partly hindered in some cases. These problems have a considerable influence specifically in the photoelectric conversion element used for shooting 8K resolution images because each of the pixels is formed extremely small. When the size of one pixel is a 3 µm×3 µm square, for example, a 1 µm-square region having weak adhesion between the photoelectric conversion layer and the hole injection blocking layer formed in a region occupied by one pixel is more considerably influenced by these problems than the case where the size of one pixel is larger.

Note that crystallinity of the gallium oxide layer can be improved by heat treatment after the deposition. When the gallium oxide is deposited with MOCVD, the temperature needs to be set high because carbon and hydrogen are taken into the film if the deposition is performed at a low temperature. In any case, heat treatment at a high temperature is required to obtain a high quality gallium oxide layer. However, when a selenium-based material is used for the photoelectric conversion layer, on which a gallium oxide layer is formed, sublimation is likely to cause because of a low melting point of selenium (221° C.), so that heat treatment at a high temperature might damage the photoelectric conversion layer.

Therefore, a material which generates fewer particles than gallium oxide during the deposition is used as the hole injection blocking layer 103 in one embodiment of the present invention. A material having crystallinity closer to that of the photoelectric conversion layer 102 than that of gallium oxide is used for the hole injection blocking layer 103. In addition, a material with which a high quality film can be formed without seriously damaging the photoelectric conversion layer 102 is used for the hole injection blocking layer 103.

Specifically, in one embodiment of the present invention, an oxide material is used for the hole injection blocking layer 103. As the oxide material used for the hole injection blocking layer 103, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide.

Note that, for example, an "In—Ga—Zn oxide" means an oxide containing In, Ga, and Zn as its main components here, and may contain another metal element in addition to In, Ga, and Zn. In this specification, a film containing the In—Ga—Zn oxide is also referred to as an IGZO film.

As an oxide used for the hole injection blocking layer 103, an In—Ga—Zn oxide is effectively used in particular. The In—Ga—Zn oxide is likely to form a film having a c-axis aligned crystalline (CAAC) structure or a microcrystalline oxide film. The In—Ga—Zn oxide is preferably used for the hole injection blocking layer 103 because it becomes a film having a crystal and is well suited for the photoelectric conversion layer 102, which has a crystal. Note that the In—Ga—Zn oxide contains at least In, Ga, Zn, and O.

A film having a CAAC structure has specifically high crystallinity as described below. The photoelectric conversion layer 102 is preferably a crystalline selenium layer, for example, because a film having a CAAC structure which serves as the hole injection blocking layer 103 is likely to form and to adhere better to the photoelectric conversion layer 102 at the interface due to the common crystallinity of the both layers.

Note that the In—Ga—Zn oxide which can be used for the hole injection blocking layer 103 can have a variety of compositions. For example, an In—Ga—Zn oxide whose atomic ratio of In to Ga and Zn is 1:3:2, 1:3:3, 1:3:4, 1:3:6, 1:4:5, 1:6:4, or 1:9:6 can be used. An In—Ga—Zn oxide whose atomic ratio of In to Ga and Zn is 1:1:1, 2:1:3, 5:5:6, or 3:1:2 can be used for the hole injection blocking layer 103.

Although a film used for the hole injection blocking layer 103 typically can be formed by sputtering or plasma-enhanced CVD, such films may be formed by another method such as thermal CVD. Examples of the thermal CVD method include a MOCVD method and an atomic layer deposition (ALD) method.

Since plasma is not used for deposition, thermal CVD has an advantage that no defect due to plasma damage is generated. Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

A facing-target-type sputtering apparatus can be used for deposition of an oxide. Deposition with the facing-target-type sputtering apparatus can also be referred to as vapor deposition SP (VDSP).

Note that a forming method and physical properties of an oxide will be detailed in a later embodiment.

<Second Electrode 104>

Then, the second electrode 104 will be described. The second electrode 104 is used as a positive electrode, for example. The following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like, for example. In particular, indium tin oxide or indium tin oxide containing silicon is preferably used. The second electrode 104 is not limited to a single layer, and may be a stacked layer of different films. Note that indium tin oxide contains In, Sn, and O.

The second electrode 104 preferably has a high light-transmitting property so that light reaches the photoelectric conversion layer 102. The light-transmitting property is further important especially for the 8K imaging device because an area occupied by one pixel is extremely small and an area which can be used for receiving light is extremely small. The second electrode 104 can be formed by a sputtering method or a plasma CVD method.

<Electron Injection Blocking Layer 105>

The electron injection blocking layer 105 will be described. The electron injection blocking layer 105 is a layer which suppresses electron injection into the photoelectric conversion layer 102 from the first electrode 101. The electron injection blocking layer 105 can contain nickel oxide, antimony sulfide, or the like.

<Band Structure of Photoelectric Conversion Element>

Figure 2:
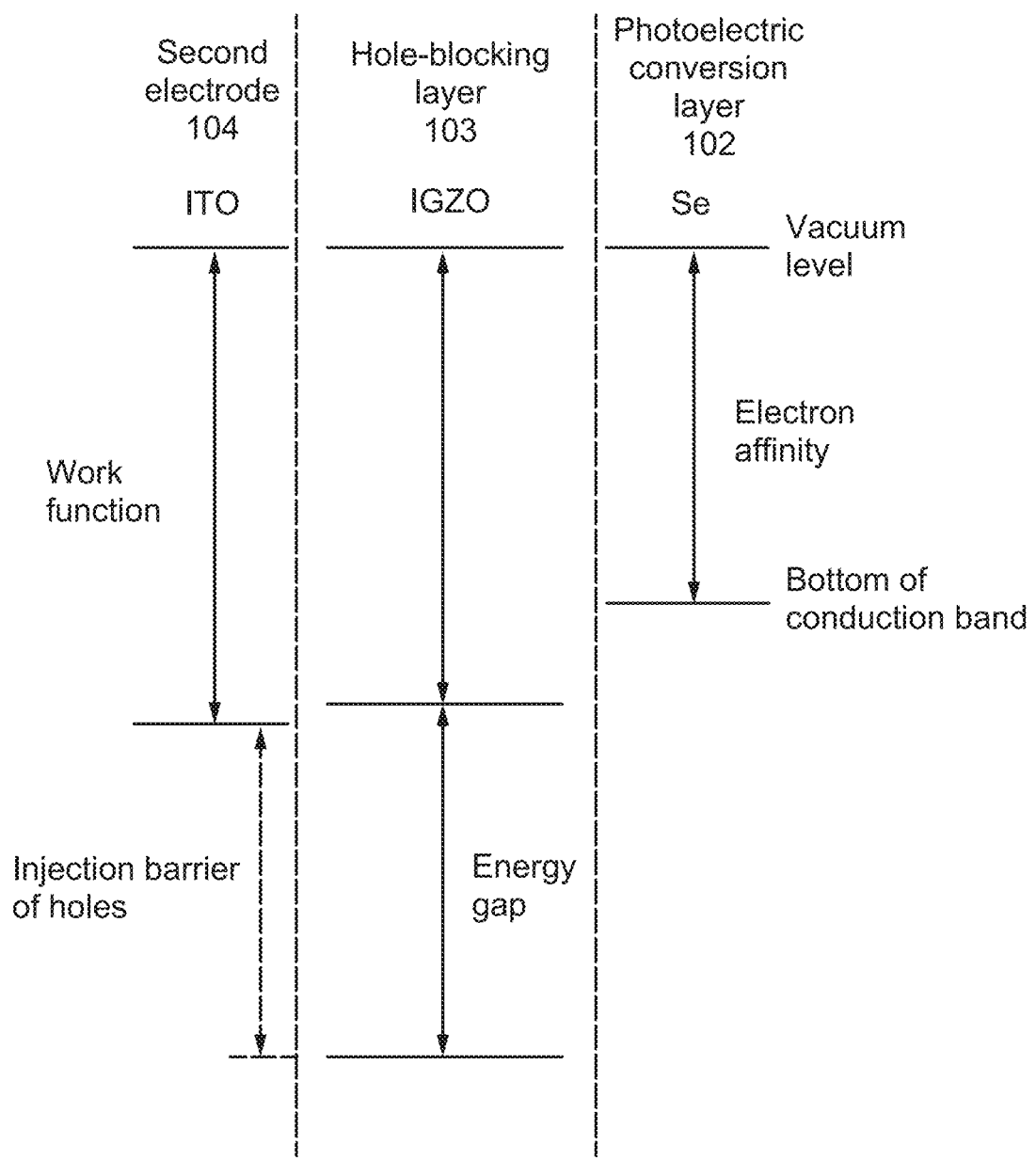
FIG. 2 is a band diagram of a photoelectric conversion element.

Next, a schematic diagram of band structures of the photoelectric conversion element 100 in FIG. 1A is illustrated in FIG. 2. The schematic diagram in FIG. 2 illustrates band structures formed when crystalline Se is used for the photoelectric conversion layer 102, an IGZO film (for example, In:Ga:Zn=1:3:6 (atomic ratio)), which is an oxide film, is used for the hole injection blocking layer 103, and indium tin oxide is used for the second electrode 104. Note that the Fermi levels change in a certain degree due to the composition, the crystal structure, or the like of the IGZO film. Therefore, the IGZO film can be formed in such a manner that its composition, crystal structure, or the like is selected as appropriate so as to have physical properties required as the hole injection blocking layer 103 which is the objective.

Here, it is known that an electron affinity (a difference in energy between a vacuum level and a bottom of a conduction band) of selenium is approximately 3.5 eV and the energy gap is between 1.8 eV and 2.0 eV. An electron affinity of an IGZO film (In:Ga:Zn=1:3:6 (atomic ratio)) is approximately 4.5 eV and the energy gap is 3.3 eV. It is also known that the work function of indium tin oxide is 4.7 eV. Then, the relation between the band structures is illustrated in FIG. 2.

The hole injection blocking layer 103 is focused on. As understandable from FIG. 2, a large barrier of the IGZO film blocks hole injection from the second electrode 104; therefore, a dark current of the photoelectric conversion element 100 is reduced, so that the S/N ratio can be improved. Accordingly, an imaging element of one embodiment of the present invention including the photoelectric conversion element 100 has improved imaging performance, which makes it easy to perform imaging under a low illuminance condition.

Figure 21A:
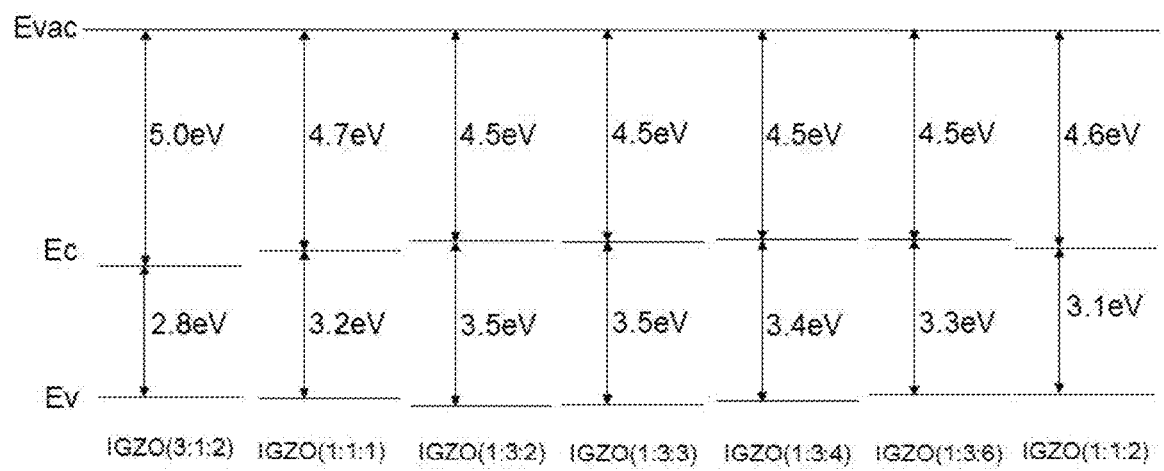
FIGS. 21A and 21B show electron affinity and energy gaps of IGZO films.
Figure 21B:
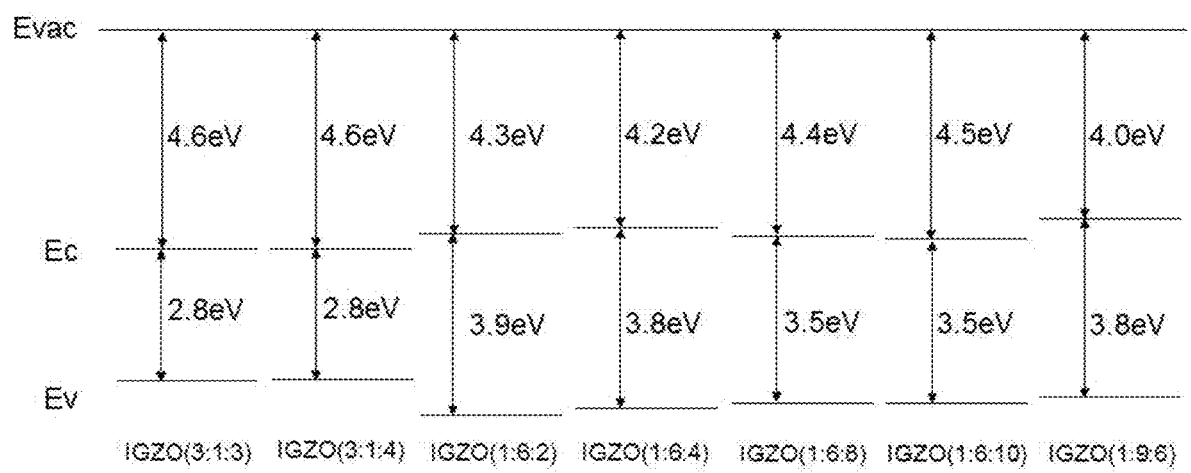

FIGS. 21A and 21B show electron affinities and energy gaps of IGZO films. As shown in FIGS. 21A and 21B, it is understandable that an IGZO film having compositions other than the atomic ratio of In:Ga:Zn=1:3:6 can serve as a hole injection blocking layer.

The structure described in this embodiment can be used in appropriate combination with the structure described in any of the other embodiments.

Embodiment 2

Figure 3A:
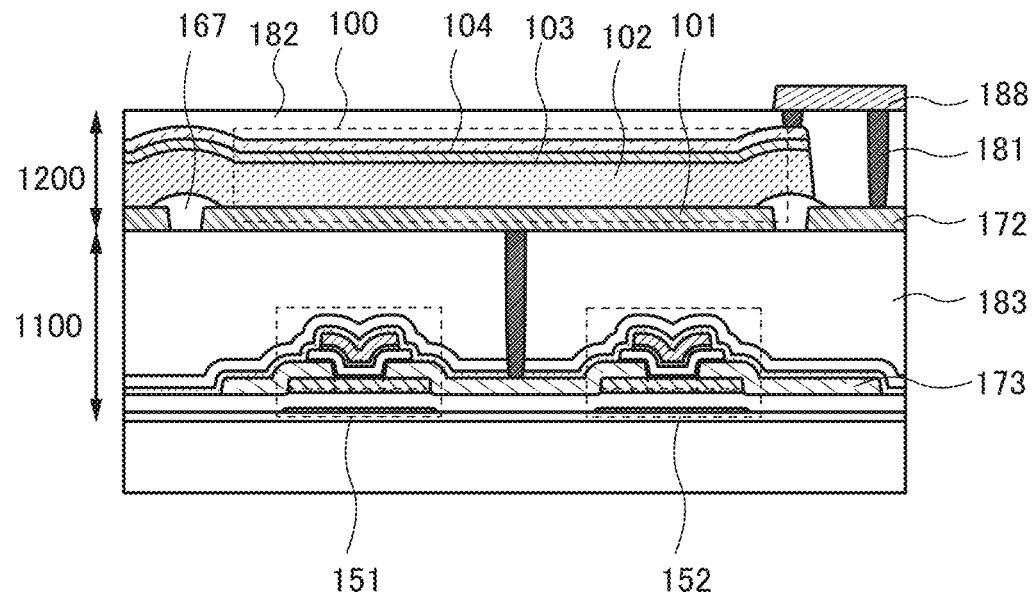
FIGS. 3A to 3C are cross-sectional views each illustrating a structure of an imaging device.

Next, specific structure examples of an imaging device of one embodiment of the present invention will be described with reference to drawings. FIG. 3A is an example of a cross-sectional view of an imaging device of one embodiment of the present invention and illustrates an example of specific connection between the photoelectric conversion element 100 in FIGS. 1A and 1B and driver transistors. The imaging device includes a layer 1100 including a transistor 151 and a transistor 152 and a layer 1200 including the photoelectric conversion element 100.

Although the wirings, the electrodes, and the conductors are illustrated as independent components in cross-sectional views in this embodiment, some of them are provided as one component in some cases when they are electrically connected to each other. In addition, a structure in which a gate electrode, a source electrode, or a drain electrode of the transistor is connected to the wirings through the conductor is only an example, and the gate electrode, the source electrode, and the drain electrode of the transistor might each function as a wiring.

In addition, an insulating layer 182, an insulating layer 183, and the like that function as protective films, interlayer insulating films, or planarization films are provided over the components. For example, an inorganic insulating film such as a silicon oxide film or a silicon oxynitride film can be used as each of the insulating layers 182 and 183 and the like. Alternatively, an organic insulating film such as an acrylic resin film or a polyimide resin film may be used. Top surfaces of the insulating layers 182 and 183 and the like are preferably planarized by chemical mechanical polishing (CMP) or the like as necessary.

In some cases, one or more of the wirings and the like illustrated in the drawing are not provided or a wiring, a transistor, or the like that is not illustrated in the drawing is included in each layer. In addition, a layer that is not illustrated in the drawing might be included in the stacked-layer structure. Furthermore, one or more of the layers illustrated in the drawing are not included in some cases.

It is particularly preferable to use transistors including an oxide as a semiconductor (OS transistors) as the transistors 151 and 152.

Extremely low off-state current characteristics of the OS transistor can widen the dynamic range of imaging. Since the transistor using an oxide semiconductor has an extremely small off-state current, a current corresponding to the gate potential can be accurately output even when the gate potential is extremely low. Thus, it is possible to widen the detection range of illuminance, i.e., the dynamic range.

A period during which charge can be held in the charge accumulation portion can be extremely long owing to the low off-state current of the transistors 151 and 152. Therefore, a global shutter system in which accumulation operation is performed in all the pixels at the same time can be used without a complicated circuit structure and operation method.

Figure 22A:
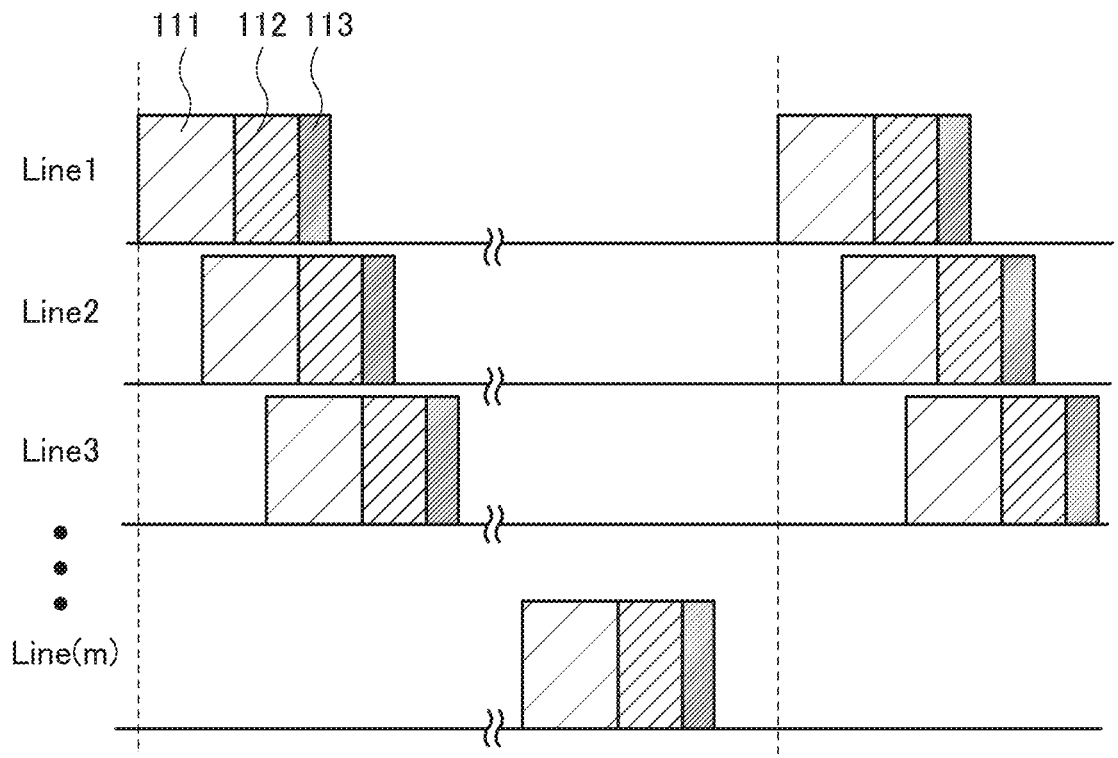
FIGS. 22A and 22B show operations of a rolling shutter system and a global shutter system, respectively.

In general, in an imaging device where pixels are arranged in a matrix, a rolling shutter system is employed in which imaging operation 111, data storage operation 112, and reading operation 113 are performed row by row as illustrated in FIG. 22A. In the case of employing the rolling shutter system, simultaneousness of imaging is lost. Therefore, when an object moves, an image is distorted.

Figure 22B:
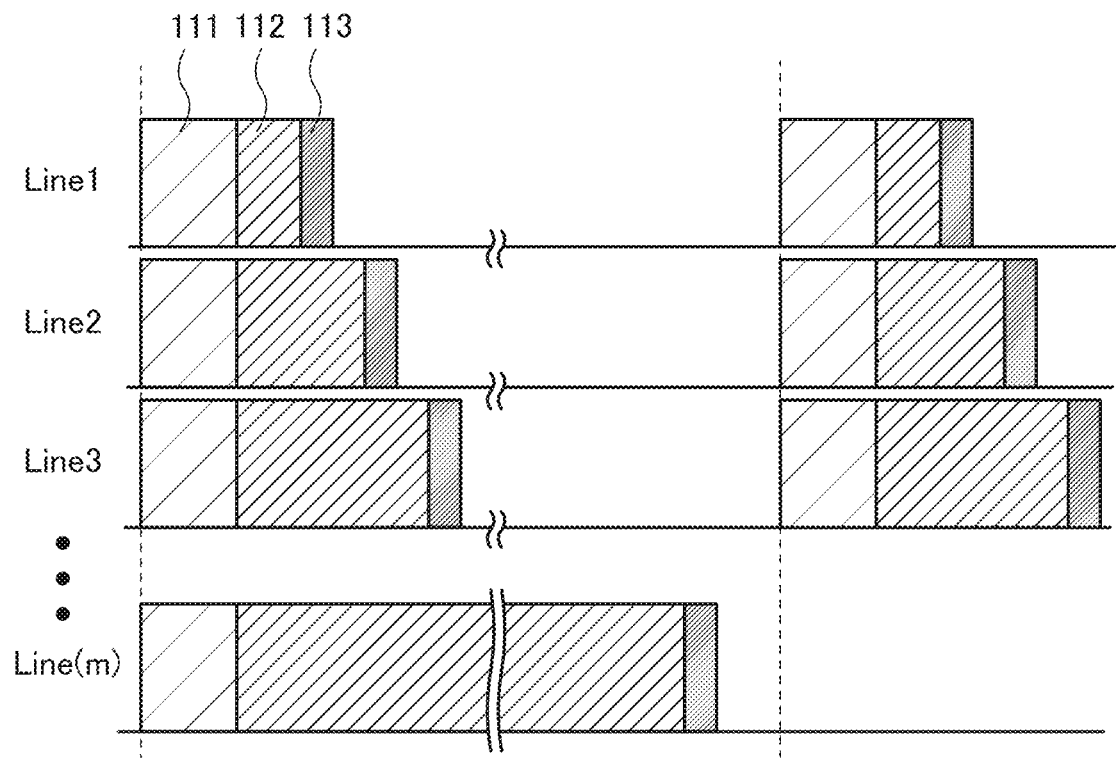

As a result, in one embodiment of the present invention, it is preferable to employ a global shutter system in which the imaging operation 111 can be performed simultaneously in all the rows and the read operation 113 can be sequentially performed row by row as illustrated in FIG. 22B. By employing the global shutter system, simultaneousness of imaging in all the pixels in the imaging device can be secured, and an image with little distortion can be easily obtained even when an object moves. Furthermore, exposure time (a period for conducting charge accumulation operation) can be long in a global shutter system; thus, the imaging device is suitable for imaging even in a low illuminance environment.

In addition, the OS transistor has lower temperature dependence of change in electrical characteristics than a transistor including silicon in an active region or an active layer (hereinafter referred to as a Si transistor), and thus can be used in an extremely wide range of temperatures. Therefore, an imaging device and a semiconductor device that include OS transistors are suitable for use in automobiles, aircrafts, spacecrafts, and the like.

Moreover, the OS transistor has higher drain breakdown voltage than the Si transistor. In a photoelectric conversion element including a selenium-based material in a photoelectric conversion layer, a relatively high voltage (e.g., 10 V or higher) is preferably applied so that an avalanche phenomenon easily causes. Therefore, by combination of the OS transistor and the photoelectric conversion element including a selenium-based material in the photoelectric conversion layer, a highly reliable imaging device can be obtained.

Figure 3B:
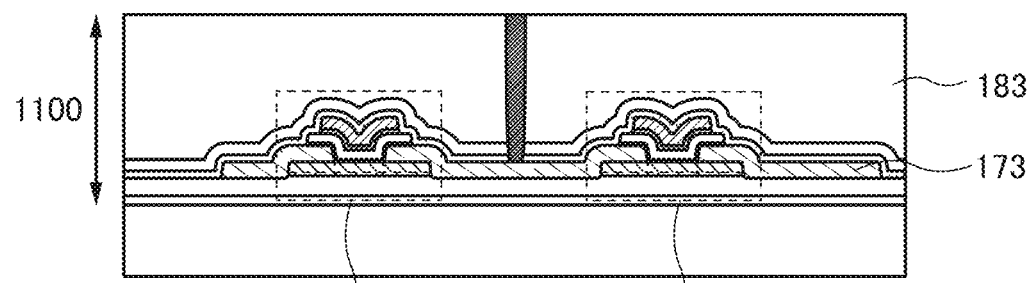
Figure 3C:
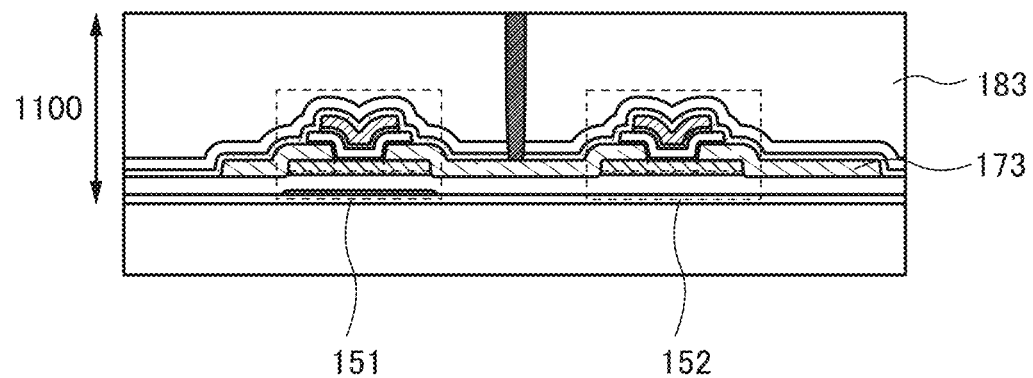

Note that although each transistor includes a back gate in FIG. 3A, each transistor does not necessarily include a back gate as illustrated in FIG. 3B. Alternatively, as illustrated in FIG. 3C, one or more transistors, for example, only the transistor 151 may include a back gate. The back gate might be electrically connected to a front gate of the transistor, which is provided to face the back gate. Alternatively, different fixed potentials might be supplied to the back gate and the front gate. Note that the presence or absence of the back gate can also be applied to another imaging device described in this embodiment.

A variety of elements can be used as the photoelectric conversion element 100 provided in the layer 1200. FIG. 3A illustrates the photoelectric conversion element 100 including a selenium-based material for the photoelectric conversion layer 102. The photoelectric conversion element 100 including a selenium-based material has high external quantum efficiency with respect to visible light. Such a photoelectric conversion element can be a highly sensitive sensor in which the amount of amplification of electrons with respect to the amount of incident light is large because of an avalanche phenomenon. Furthermore, the selenium-based material has a high light-absorption coefficient, which leads to an advantage that the photoelectric conversion layer 102 can be formed thin easily.

The materials described in Embodiment 1 can be used as a material used for each layer in the photoelectric conversion element 100.

Figure 4A:
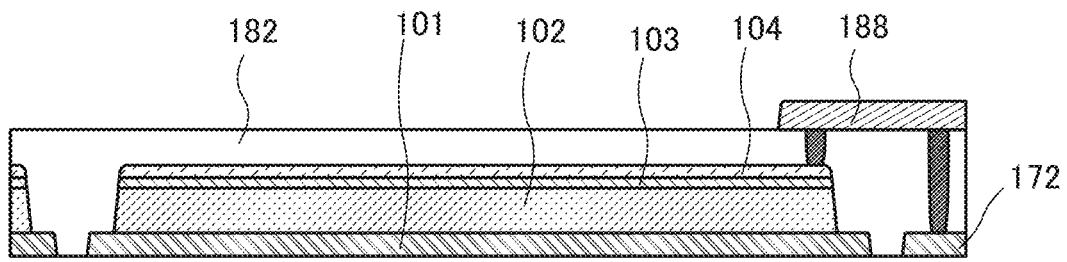
FIGS. 4A to 4D are cross-sectional views each illustrating a connection configuration of a photoelectric conversion element.
Figure 4B:
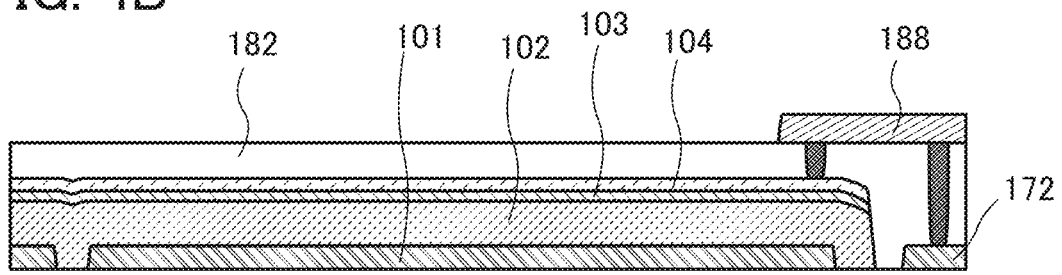
Figure 4C:
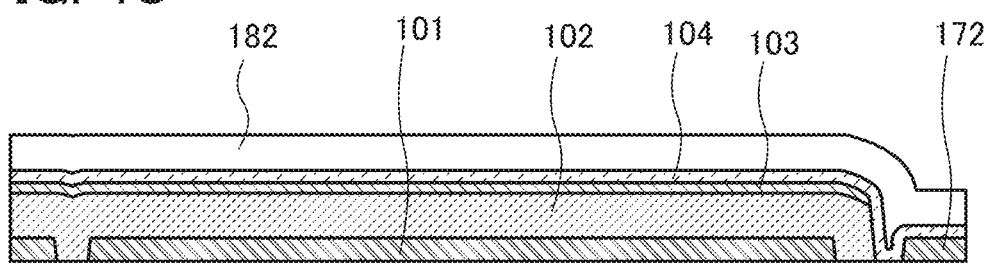
Figure 4D:
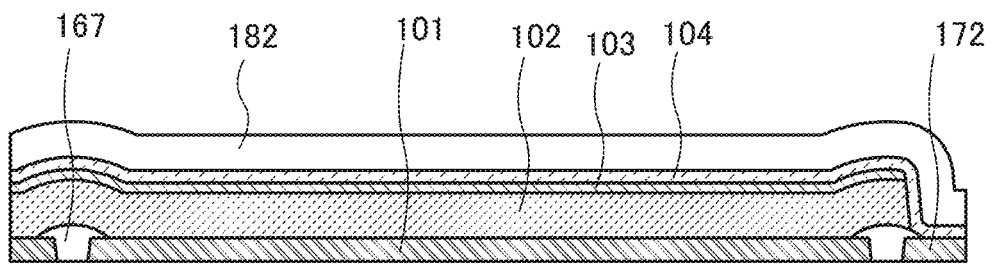

Although the photoelectric conversion layer 102 and the light-transmitting second electrode 104 are not divided between photoelectric conversion elements in FIG. 3A, they may be divided between photoelectric conversion elements as illustrated in FIG. 4A. In a region, between pixels, where the first electrode 101 is not provided, a partition wall 167 formed of an insulator is preferably provided, thereby preventing generation of a crack in the photoelectric conversion layer 102 and the light-transmitting second electrode 104. However, the partition wall 167 is not necessarily provided as illustrated in FIG. 4B. Although the light-transmitting second electrode 104 and the wiring 172 are connected to each other through a wiring 188 and a conductor 181 in FIG. 3A, the light-transmitting second electrode 104 and the wiring 172 may be in direct contact with each other as in FIGS. 4C and 4D.

The first electrode 101 illustrated in FIG. 3A, and FIGS. 4A to 4D preferably has a high flatness in order to prevent a short circuit with the light-transmitting second electrode 104 caused by, for example, poor coverage with the photoelectric conversion layer 102.

Note that the partition wall 167 can be formed using an inorganic insulator, an insulating organic resin, or the like. The partition wall 167 may be colored black or the like in order to shield the transistors and the like from light and/or to determine the area of a light-receiving portion in each pixel.

The photoelectric conversion element 100 may include an electron injection blocking layer in addition to the hole injection blocking layer 103.

Figure 5:
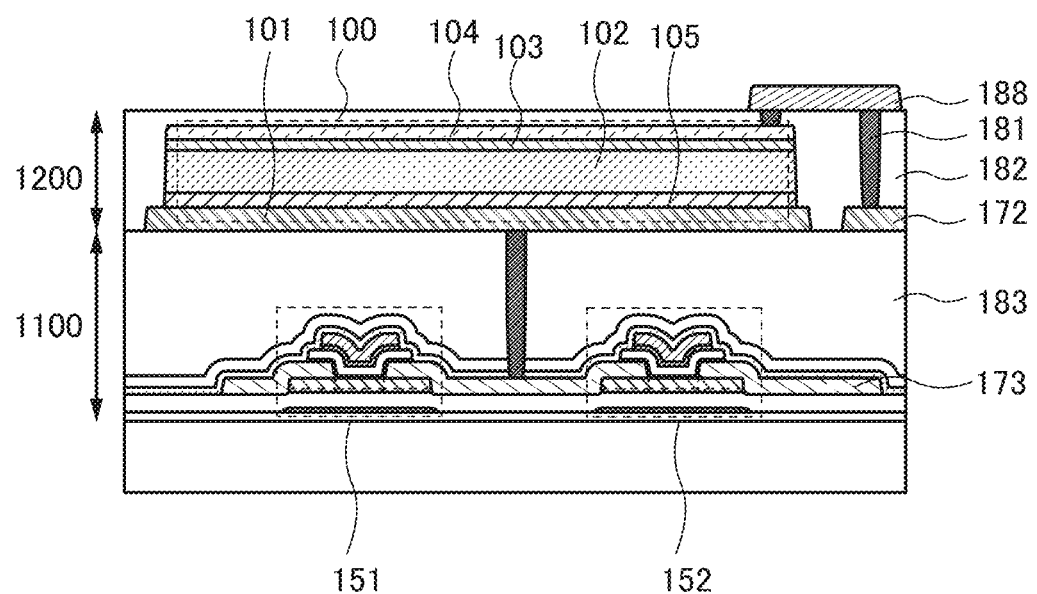
FIG. 5 is a cross-sectional view illustrating a structure of an imaging device.

For example, FIG. 5 is an example in which the photoelectric conversion element 100 includes the hole injection blocking layer 103 and the electron injection blocking layer 105. In the photoelectric conversion element, the electron injection blocking layer 105, the photoelectric conversion layer 102, and the hole injection blocking layer 103 are stacked in this order. The photoelectric conversion layer 102 is preferably a crystalline selenium layer. The materials described in Embodiment 1 can be used for the hole injection blocking layer 103. The electron injection blocking layer 105 can contain nickel oxide, antimony sulfide, or the like.

In the photoelectric conversion element 100 in FIG. 5, the electron injection blocking layer 105 is electrically connected to the first electrode 101 that is electrically connected to the transistors 151 and 152. Furthermore, the light-transmitting second electrode 104 is electrically connected to the wiring 172 through the wiring 188 and the conductor 181.

FIGS. 6A to 6F show other examples of the structure of the photoelectric conversion element 100 including the hole injection blocking layer 103 and the electron injection blocking layer 105 and the connection configuration between the photoelectric conversion element 100 and the wirings. Note that the structure of the photoelectric conversion element 100 and the connection between the photoelectric conversion element 100 and the wirings are not limited thereto, and other configurations may be applied.

Figure 6A:
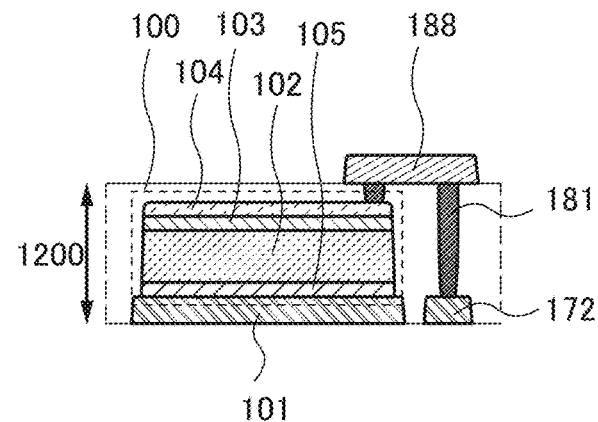
FIGS. 6A to 6F are cross-sectional views each illustrating a connection configuration of a photoelectric conversion element.

FIG. 6A illustrates a structure of the photoelectric conversion element 100 that includes the light-transmitting second electrode 104 in contact with the hole injection blocking layer 103. The light-transmitting second electrode 104 serves as an electrode and can increase the output current of the photoelectric conversion element 100.

For the light-transmitting second electrode 104, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like, for example. The light-transmitting second electrode 104 is not limited to a single layer, and may be a stacked layer of different films.

Figure 6B:
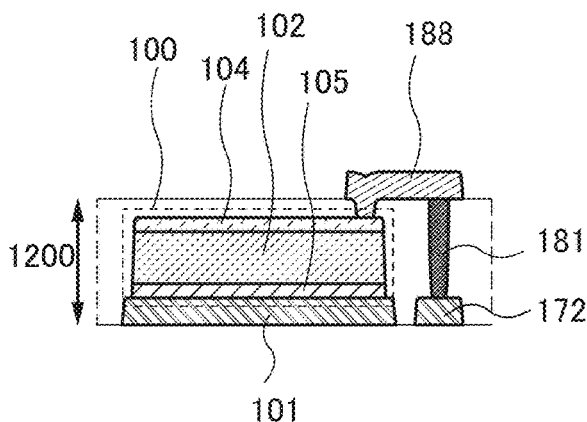

FIG. 6B illustrates a structure in which the light-transmitting second electrode 104 is electrically connected to the wiring 188.

Figure 6C:
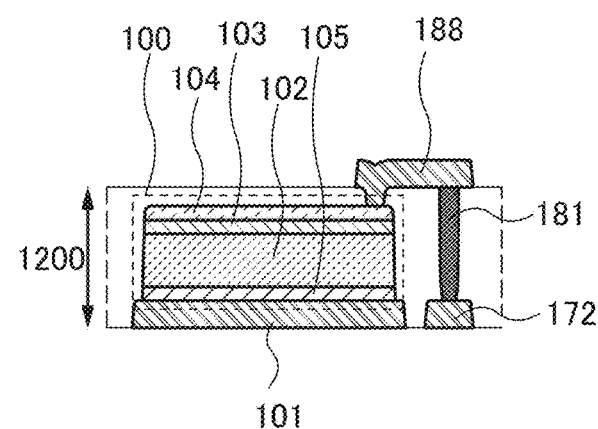

FIG. 6C illustrates a structure, of the photoelectric conversion element 100, in which the light-transmitting second electrode 104 in contact with the hole injection blocking layer 103 is provided and the wiring 188 is electrically connected to the light-transmitting second electrode 104.

Figure 6D:
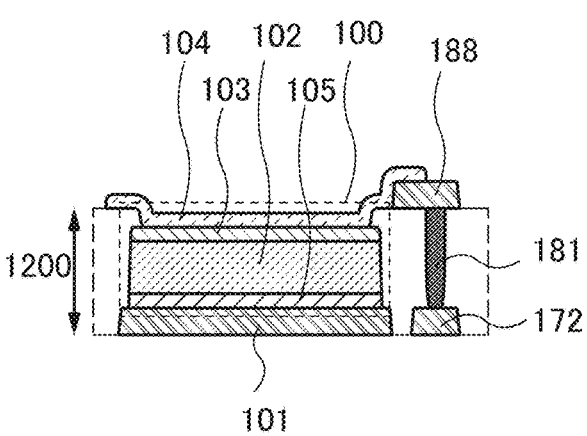

FIG. 6D illustrates a structure in which an opening exposing the hole injection blocking layer 103 is provided in an insulating layer covering the photoelectric conversion element 100, and the light-transmitting second electrode 104 that covers the opening is electrically connected to the wiring 188.

Figure 6E:
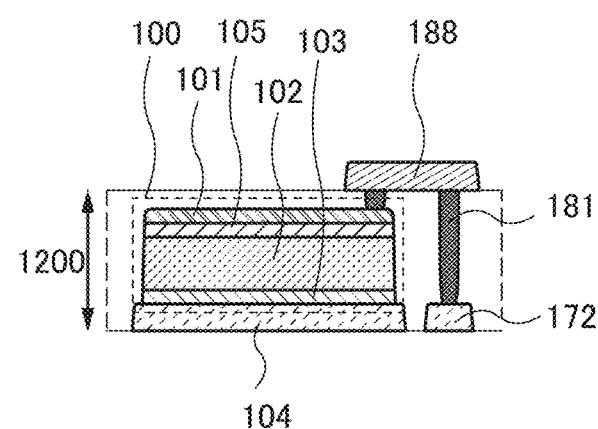

FIG. 6E includes an upside-down stack structure of the photoelectric conversion element 100 in FIG. 6A. External light may be received through the light-transmitting second electrode 104. In that case, the photoelectric conversion element 100 in FIG. 6E receives light from the substrate side; thus, the substrate also has light-transmitting property.

Figure 6F:
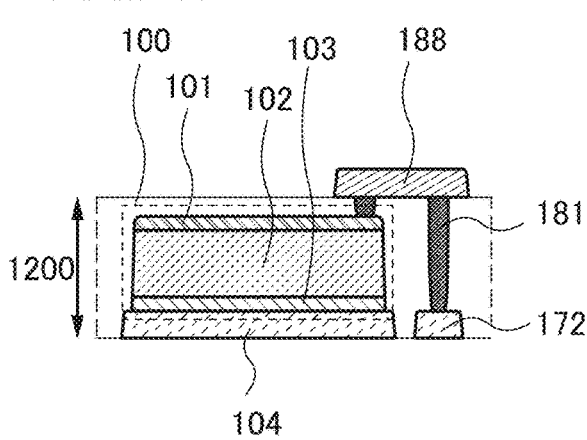

FIG. 6F illustrates the photoelectric conversion element 100 in FIG. 6E in which an electron injection blocking layer is not provided.

In the photoelectric conversion elements 100 in FIGS. 6E and 6F, the hole injection blocking layer 103 is provided over the light-transmitting second electrode 104. For example, in the case where an indium tin oxide film or an indium tin oxide film to which silicon is added is used as the light-transmitting second electrode and an In—Ga—Zn oxide or the like is used for the hole injection blocking layer, both of the hole injection blocking layer 103 and the second electrode 104 are an oxide containing indium and have a close composition; therefore, they are well suited to each other. That is, adhesion between the hole injection blocking layer 103 and the second electrode 104 is improved and the interface has a preferable property.

When the second electrode 104 has a crystal, crystallinity of the hole injection blocking layer 103 can be easily increased. Furthermore, when the hole injection blocking layer 103 has a crystal, crystallinity of the photoelectric conversion layer 102 can be easily increased. Therefore, adhesion between the photoelectric conversion layer 102 and the hole injection blocking layer 103 is improved and the interface has a preferable property.

Thus, when an indium tin oxide film or an indium tin oxide film to which silicon is added is used as the light-transmitting second electrode, an In—Ga—Zn oxide or the like is used for the hole injection blocking layer, and a crystalline selenium layer is used as the photoelectric conversion layer 102, the interfaces between layers included in the photoelectric conversion element 100 have a preferable property and obtain high durability.

The photoelectric conversion element 100 formed using the aforementioned selenium-based material, amorphous silicon, or the like can be formed through general semiconductor manufacturing processes such as a deposition process, a lithography process, and an etching process. In addition, because the resistance of the selenium-based material is high, the photoelectric conversion layer 102 does not need to be divided between circuits as illustrated in FIG. 3A. Therefore, the imaging device of one embodiment of the present invention can be manufactured with a high yield at low cost. In contrast, a photodiode including a silicon substrate as a photoelectric conversion layer requires difficult processes such as a polishing process and a bonding process.

Figure 7A:
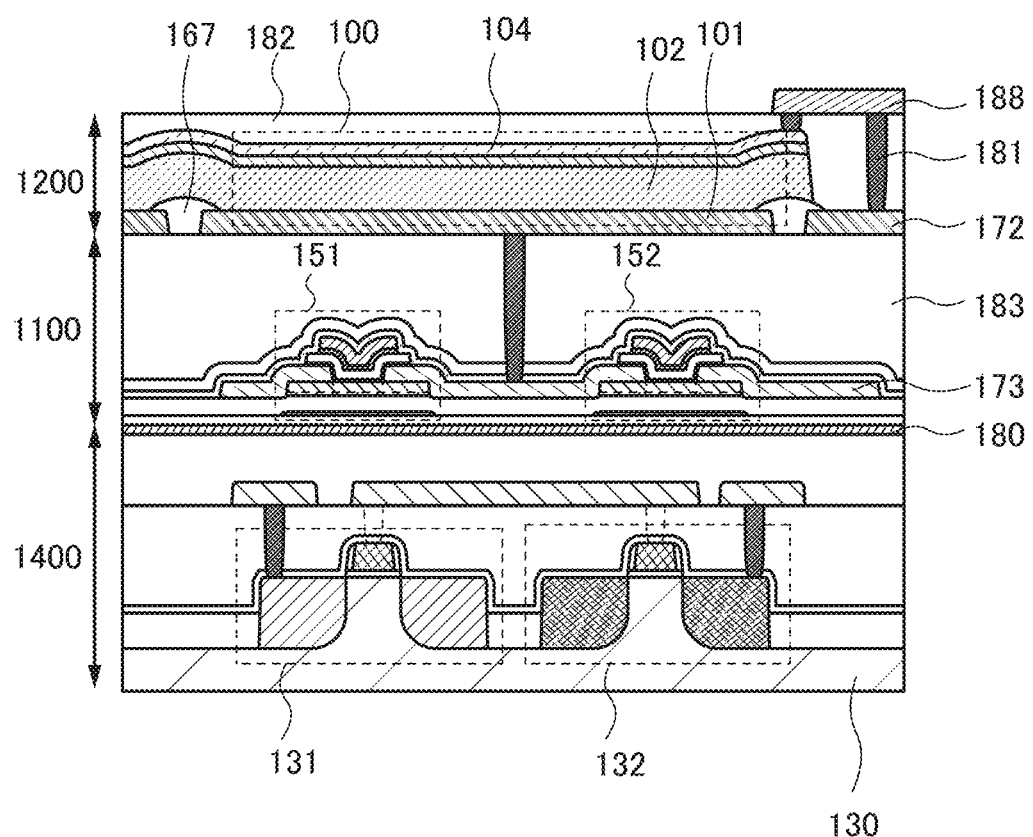
FIGS. 7A and 7B are cross-sectional views each illustrating a structure of an imaging device.
Figure 7B:
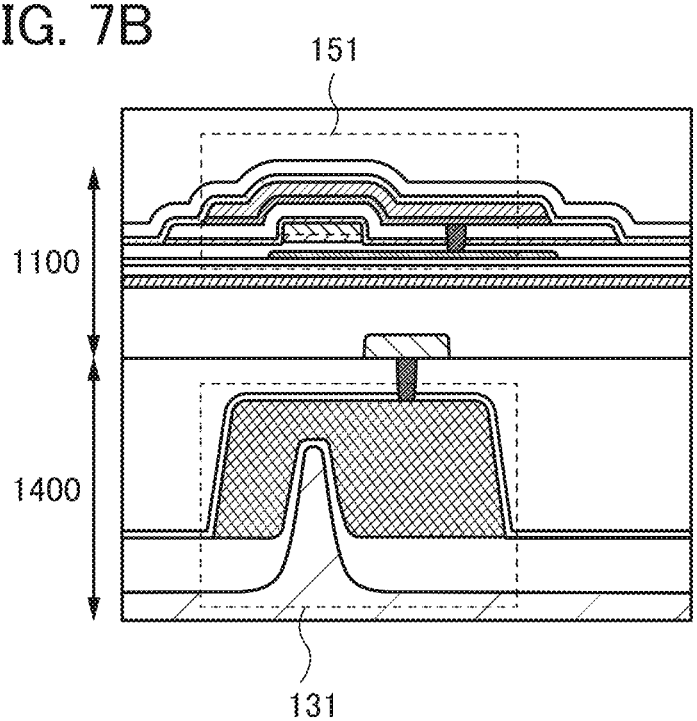

Furthermore, in the imaging device of one embodiment of the present invention, a stack including the silicon substrate 130 in which a circuit is formed may be used. For example, as illustrated in FIG. 7A, a pixel circuit may overlap with a layer 1400 that includes a transistor 131 and a transistor 132 whose active regions are formed in the silicon substrate 130. FIG. 7B corresponds to a cross-sectional view illustrating the transistor in the channel width direction.

Figure 8A:
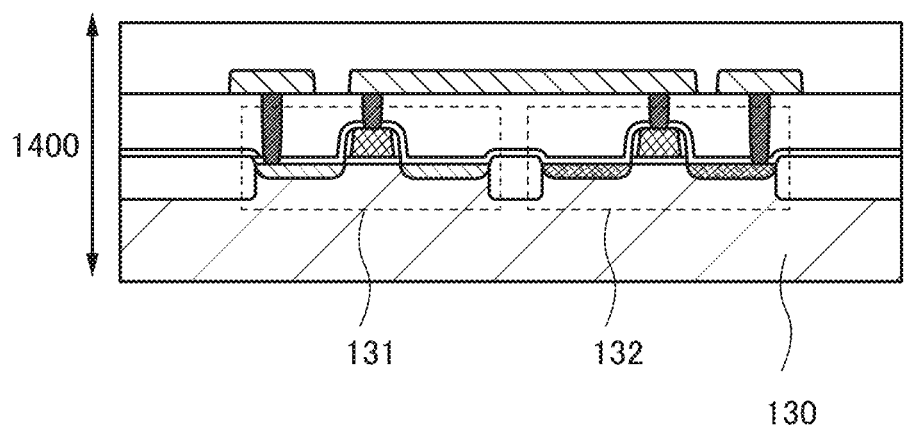
FIGS. 8A and 8B are cross-sectional views each illustrating a structure of an imaging device.
Figure 8B:
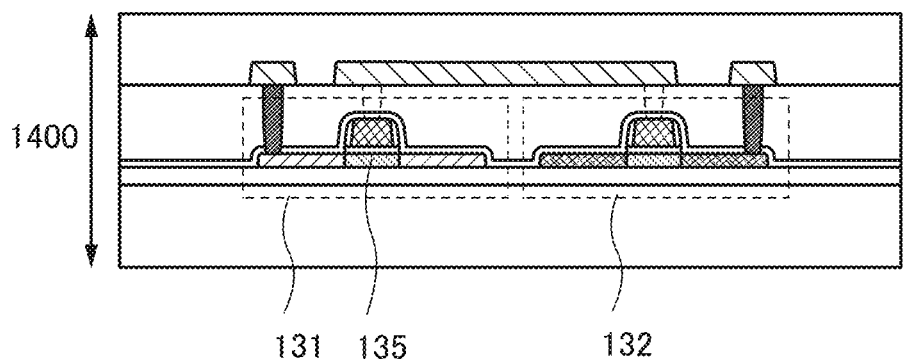

Although FIGS. 7A and 7B show the Si transistors of a fin type, the transistors may be of a planar type as illustrated in FIG. 8A. Alternatively, as illustrated in FIG. 8B, they may be transistors each including an active layer 135 formed using a silicon thin film. The active layer 135 can be formed using polycrystalline silicon or single crystal silicon of a silicon-on-insulator (SOI) structure.

The silicon substrate 130 is not limited to a bulk silicon substrate and can be a substrate made of germanium, silicon germanium, silicon carbide, gallium arsenide, aluminum gallium arsenide, indium phosphide, gallium nitride, or an organic semiconductor.

Here, as illustrated in FIG. 7A, an insulating layer 180 is provided between a region including an oxide semiconductor transistor and a region including a Si transistor.

Dangling bonds of silicon are terminated with hydrogen in insulating layers provided in the vicinities of the active regions of the transistors 131 and 132. Therefore, hydrogen has an effect of improving the reliability of the transistors 131 and 132. Meanwhile, hydrogen in insulating layers provided in the vicinity of the oxide semiconductor layer that is the active layer of the transistor 151 or the like causes generation of carriers in the oxide semiconductor layer. Therefore, the hydrogen may reduce the reliability of the transistor 151 or the like. Thus, the insulating layer 180 having a function of preventing diffusion of hydrogen is preferably provided between one layer including the transistor using a silicon-based semiconductor material and another layer stacked thereon that includes the transistor using an oxide semiconductor. Hydrogen is confined in the one layer by the insulating layer 180, so that the reliability of the transistors 131 and 132 can be improved. Furthermore, diffusion of hydrogen from the one layer to the other layer is inhibited, so that the reliability of the transistor 151 or the like can also be improved.

The insulating layer 180 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Note that as illustrated in FIG. 7A, a circuit (e.g., a driver circuit) formed on the silicon substrate 130, the transistor 151 or the like, and the photoelectric conversion element 100 can overlap with each other; thus, the integration degree of pixels can be increased. In other words, the resolution of the imaging device can be increased. Such a structure is suitable for an imaging device with, for example, 4K2K, 8K4K, or 16K8K pixels.

In the imaging device in FIG. 7A, the silicon substrate 130 is not provided with a photoelectric conversion element. Therefore, an optical path for the photoelectric conversion element 100 can be secured without being influenced by the transistors or wirings, and a pixel with a high aperture ratio can be formed.

Figure 9:
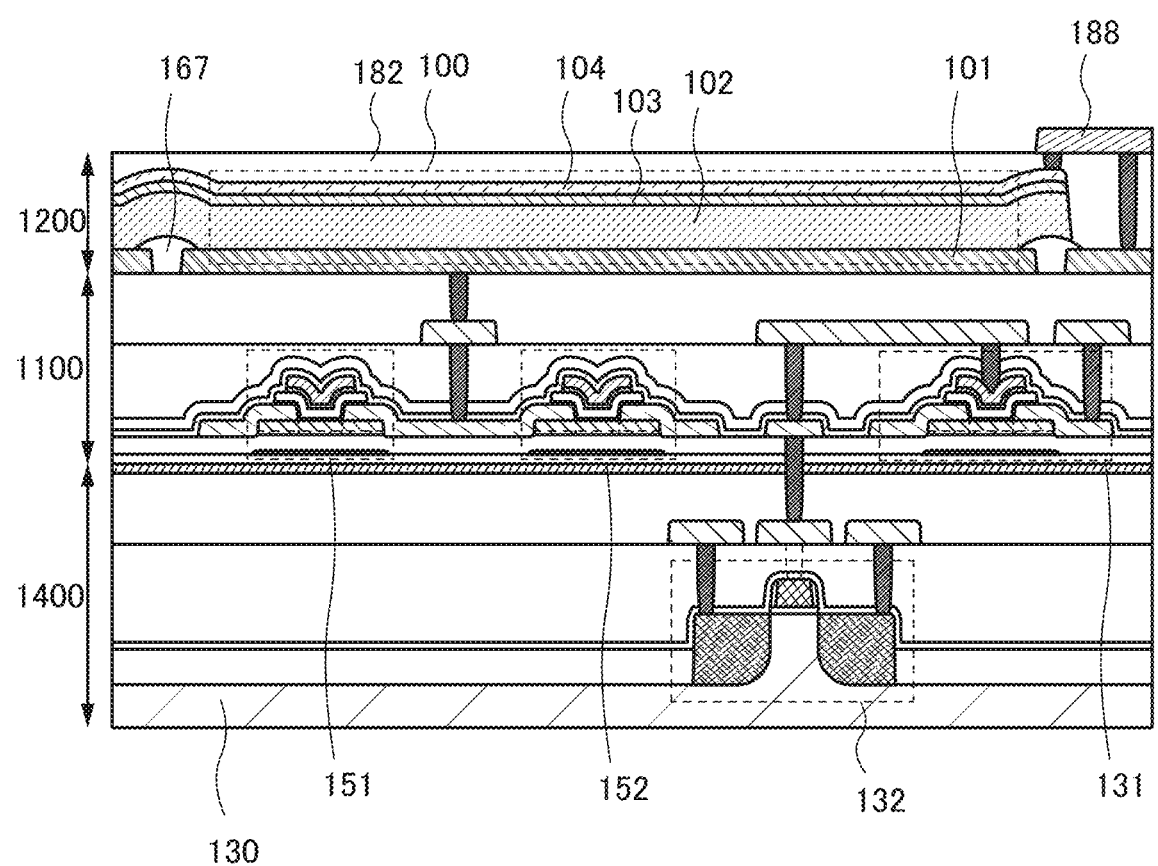
FIG. 9 is a cross-sectional view illustrating a structure of an imaging device.

The imaging device of one embodiment of the present invention can also have a structure in FIG. 9.

The imaging device in FIG. 9 is a modification example of the imaging device in FIG. 7A. A CMOS inverter is formed using an OS transistor and a Si transistor.

Here, the transistor 132 is a p-channel Si transistor provided in the layer 1400, and the transistor 131 is an n-channel OS transistor provided in the layer 1100. When only the p-channel transistor is provided on the silicon substrate 130, a step of forming a well, an n-type impurity layer, or the like can be skipped.

In the imaging device in FIG. 9, the transistor 131 can be formed through the same process as the transistors 151 and 152 formed in the layer 1100. Thus, the manufacturing process of the imaging device can be simplified.

Figure 10A:
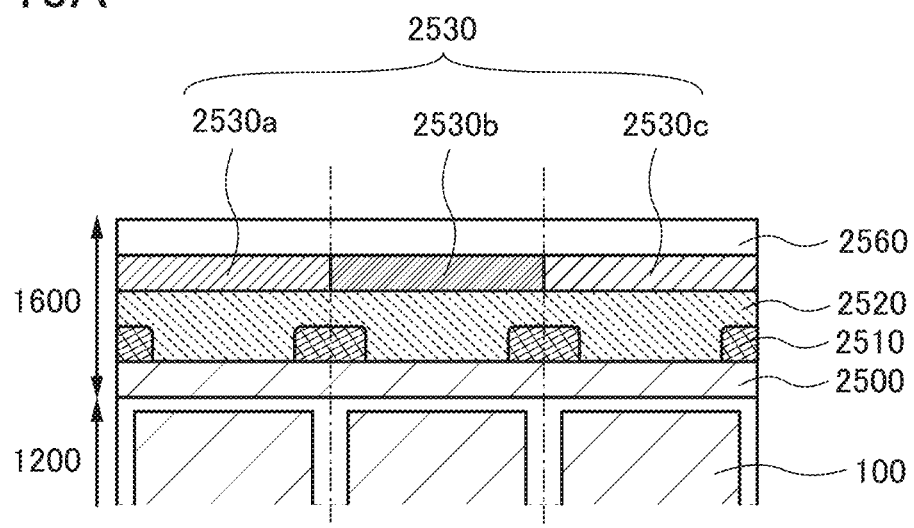
FIGS. 10A to 10C are cross-sectional views each illustrating a structure of an imaging device.

FIG. 10A is a cross-sectional view of an example of a mode in which a color filter and the like are added to the imaging. The cross-sectional view illustrates part of a region including pixel circuits for three pixels. An insulating layer 2500 is formed over the layer 1200 where the photoelectric conversion element 100 is formed. As the insulating layer 2500, for example, a silicon oxide film with a high visible-light transmitting property can be used. In addition, a silicon nitride film may be stacked as a passivation film. In addition, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through the upper color filter. The light-blocking layer 2510 can be formed of a metal layer of aluminum, tungsten, or the like, or a stack including the metal layer and a dielectric film functioning as an anti-reflection film.

An organic resin layer 2520 can be formed as a planarization film over the insulating layer 2500 and the light-blocking layer 2510. A color filter 2530 (a color filter 2530a, a color filter 2530b, and a color filter 2530c) is formed in each pixel. For example, the color filter 2530a, the color filter 2530b, and the color filter 2530c each have a color of red (R), green (G), blue (B), yellow (Y), cyan (C), magenta (M), or the like, so that a color image can be obtained.

A light-transmitting insulating layer 2560 or the like can be provided over the color filter 2530.

Figure 10B:
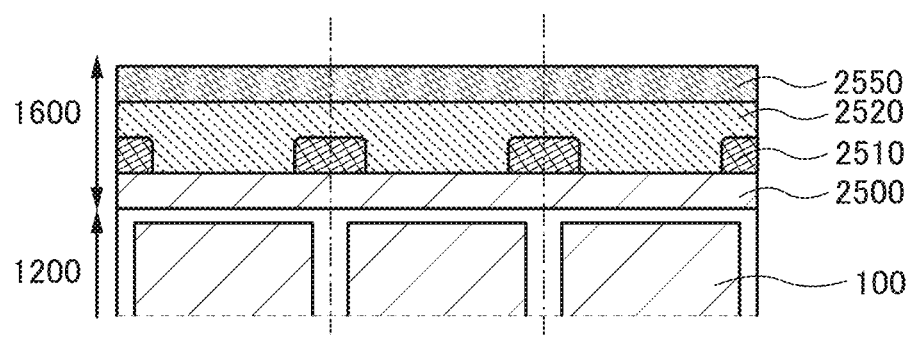

As illustrated in FIG. 10B, a photoelectric conversion layer 2550 may be used instead of the color filter 2530. Such a structure enables the imaging device to capture images in various wavelength regions.

For example, when a filter that blocks light having a wavelength shorter than or equal to that of visible light is used as the photoelectric conversion layer 2550, an infrared imaging device can be obtained. When a filter that blocks light having a wavelength shorter than or equal to that of near infrared light is used as the photoelectric conversion layer 2550, a far infrared imaging device can be obtained. When a filter that blocks light having a wavelength longer than or equal to that of visible light is used as the photoelectric conversion layer 2550, an ultraviolet imaging device can be obtained.

Furthermore, when a scintillator is used as the photoelectric conversion layer 2550, an imaging device that captures an image visualizing the intensity of radiation and is used for an X-ray imaging device or the like can be obtained. Radiation such as X-rays passes through an object to enter a scintillator, and then is converted into light (fluorescence) such as visible light or ultraviolet light owing to a phenomenon known as photoluminescence. Then, the photoelectric conversion element 100 detects the light to obtain image data. Furthermore, the imaging device having the structure may be used in a radiation detector or the like.

A scintillator is formed of a substance that, when irradiated with radiation such as X-rays or gamma rays, absorbs energy of the radiation to emit visible light or ultraviolet light or a material containing the substance. Examples of the known materials include $Gd_2O_2S:Tb$, $Gd_2O_2S:Pr$, $Gd_2O_2S:Eu$, $BaFCl:Eu$, $NaI$, $CsI$, $CaF_2$, $BaF_2$, $CeF_3$, $LiF$, $LiI$, and $ZnO$, and a resin or ceramics in which any of the materials is dispersed.

In the photoelectric conversion element 100 using a selenium-based material, radiation such as X-rays can be directly converted into charge; thus, the scintillator is not necessarily used.

A microlens array 2540 may be provided over the color filters 2530a, 2530b, and 2530c. Light penetrating lenses included in the microlens array 2540 goes through the color filters positioned directly thereunder to reach the photoelectric conversion element 100. Note that a region other than the layer 1200 in FIGS. 10A to 10C is referred to as a layer 1600.

Figure 10C:
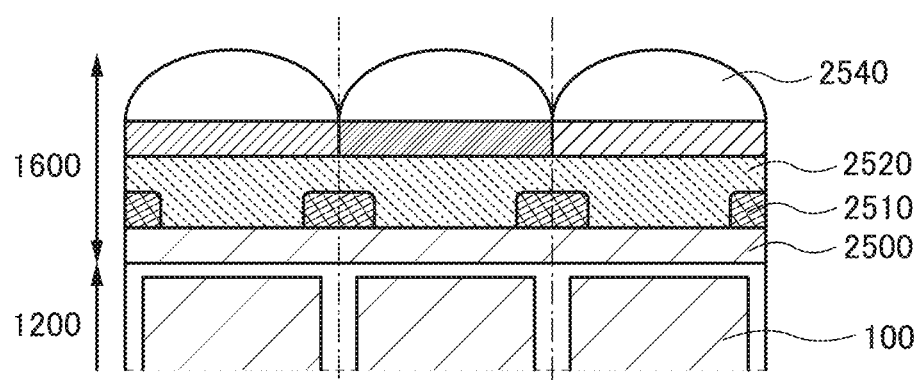
Figure 11:
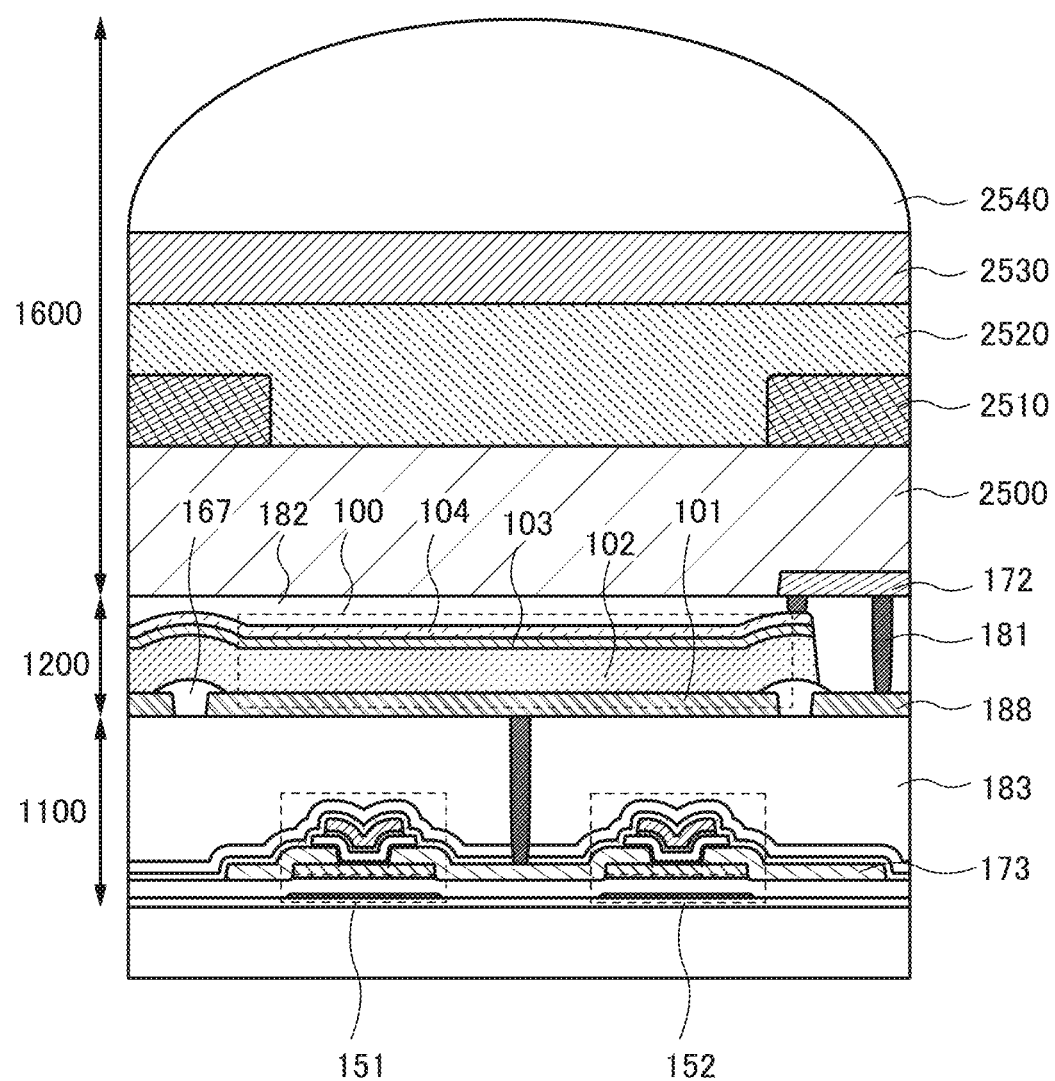
FIG. 11 is a cross-sectional view illustrating a structure of an imaging device.

The specific structure of the imaging device in FIG. 10C is illustrated in FIG. 11 by taking an example of the imaging device in FIG. 3A.

Figure 12:
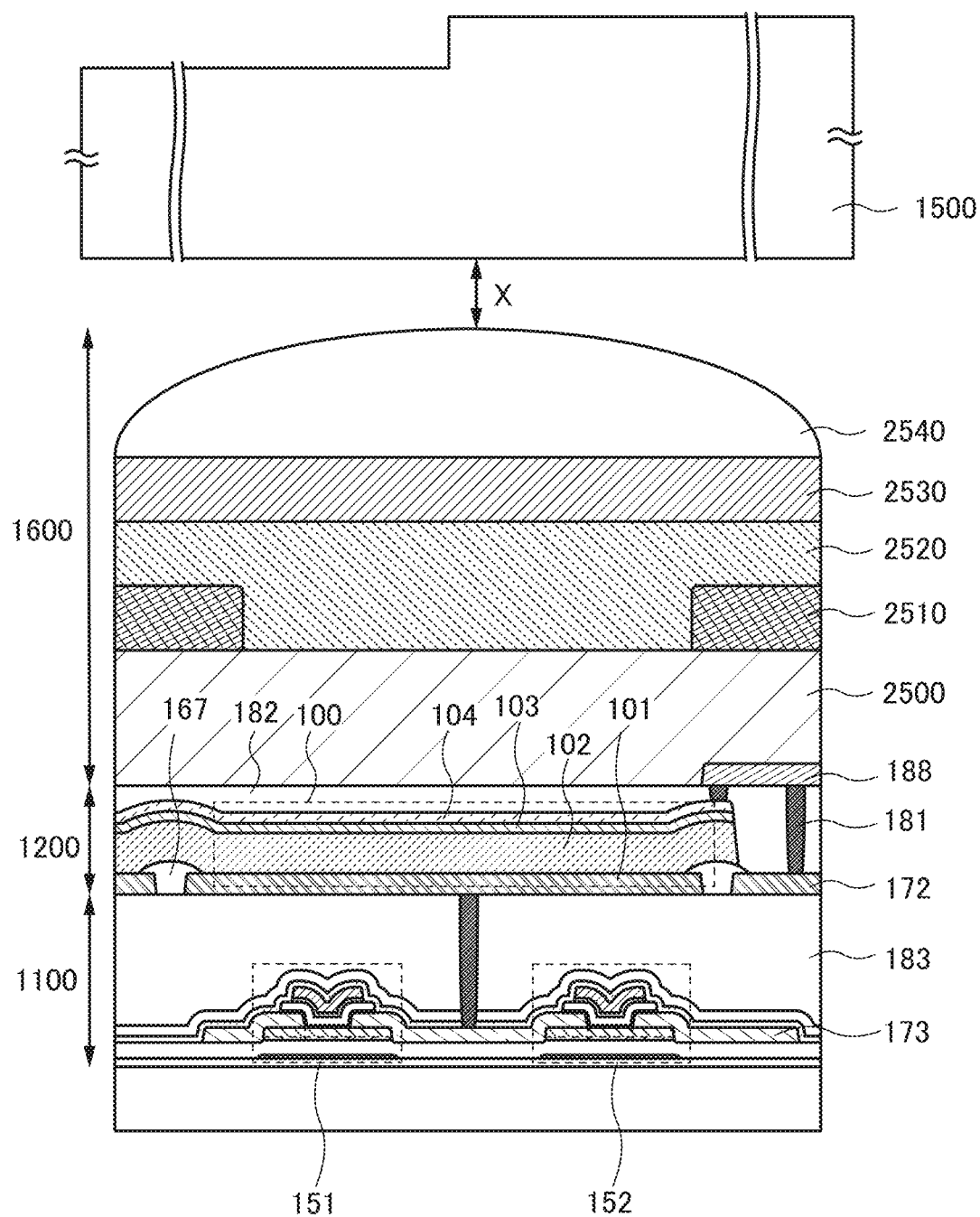
FIG. 12 is a cross-sectional view illustrating a structure of an imaging device.
Figure 13:
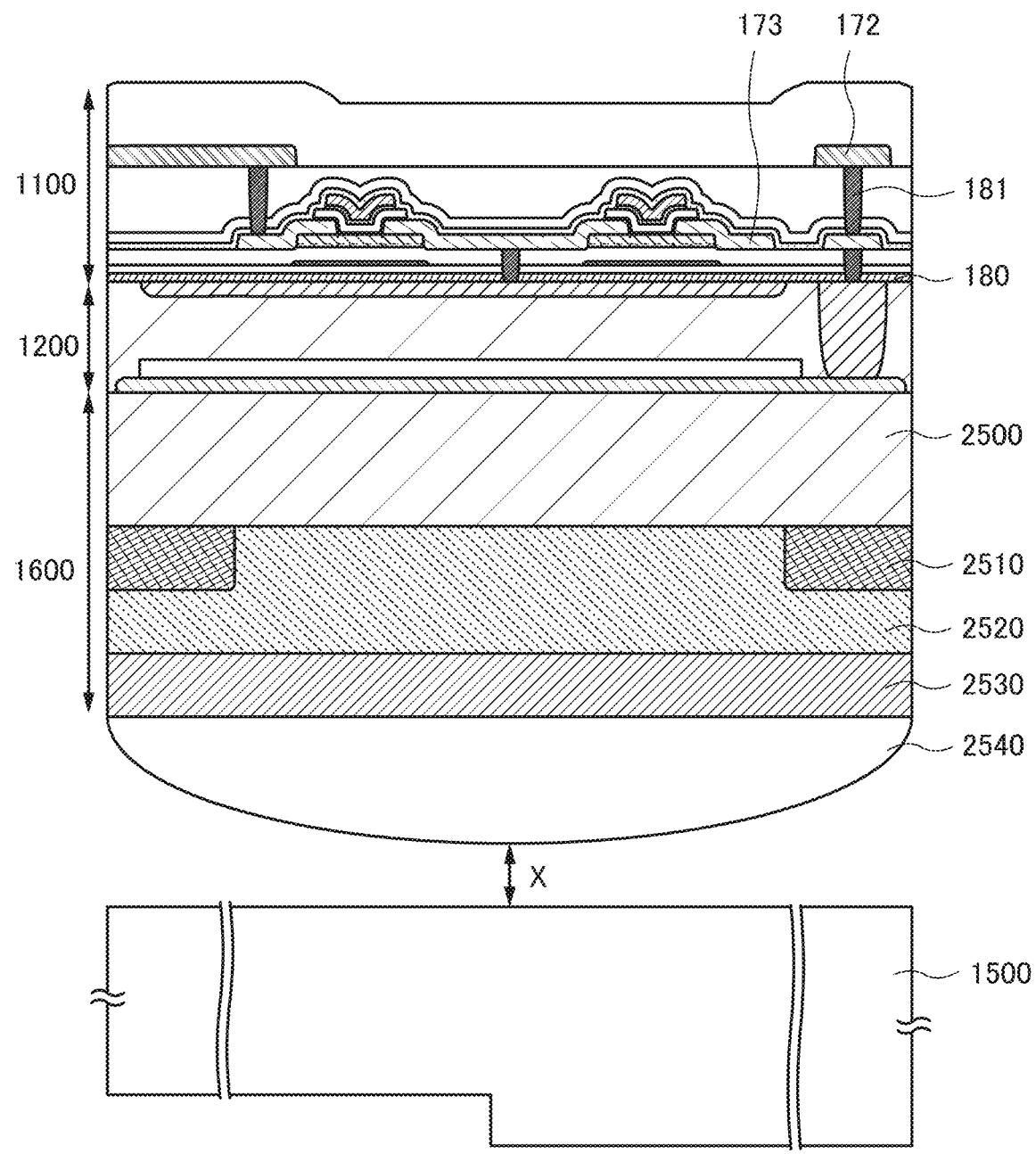
FIG. 13 is a cross-sectional view illustrating a structure of an imaging device.

The imaging device of one embodiment of the present invention may be combined with a diffraction grating 1500 as illustrated in FIG. 12 and FIG. 13. An image of an object obtained through the diffraction grating 1500 (i.e., a diffraction pattern) is scanned into a pixel, and an input image (an object image) can be formed from a captured image in the pixel by arithmetic processing. In addition, the use of the diffraction grating 1500 instead of a lens can reduce the cost of the imaging device.

The diffraction grating 1500 can be formed using a light-transmitting material. For example, an inorganic insulating film such as a silicon oxide film or a silicon oxynitride film can be used. Alternatively, an organic insulating film such as an acrylic resin film or a polyimide resin film may be used. Alternatively, a stack of the inorganic insulating film and the organic insulating film may be used.

In addition, the diffraction grating 1500 can be formed by a lithography process using a photosensitive resin or the like. Alternatively, the diffraction grating 1500 can be formed by a lithography process and an etching process. Alternatively, the diffraction grating 1500 can be formed by nanoimprint lithography, laser scribing, or the like.

Note that a space X may be provided between the diffraction grating 1500 and the microlens array 2540. The space X can be less than or equal to 1 mm, preferably less than or equal to 100 μm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Alternatively, a liquid such as silicone oil may be provided. Even in the case where the microlens array 2540 is not provided, the space X may be provided between the color filter 2530 and the diffraction grating 1500.

As illustrated in FIGS. 14A1 and 14B1, the imaging device may be bent. FIG. 14A1 illustrates a state in which the imaging device is bent in the direction of dashed-two dotted line X1-X2. FIG. 14A2 is a cross-sectional view illustrating a portion indicated by dashed-two dotted line X1-X2 in FIG. 14A1. FIG. 14A3 is a cross-sectional view illustrating a portion indicated by dashed-two dotted line Y1-Y2 in FIG. 14A1.

FIG. 14B1 illustrates a state where the imaging device is bent in the direction of dashed-two dotted line X3-X4 and the direction of dashed-two dotted line Y3-Y4. FIG. 14B2 is a cross-sectional view illustrating a portion indicated by dashed-two dotted line X3-X4 in FIG. 14B1. FIG. 14B3 is a cross-sectional view illustrating a portion indicated by dashed-two dotted line Y3-Y4 in FIG. 14B1.

Bending the imaging device can reduce field curvature and astigmatism. Thus, the optical design of lens and the like, which is used in combination of the imaging device, can be facilitated. For example, the number of lenses used for aberration correction can be reduced; accordingly, the size or weight of semiconductor devices including the imaging device can be easily reduced. In addition, the quality of a captured image can be improved.

In Embodiment 2, one embodiment of the present invention has been described. Other embodiments of the present invention will be described in Embodiments 1, 3, and 4. Note that one embodiment of the present invention is not limited thereto. In other words, various embodiments of the invention are described in this embodiment and the other embodiments, and one embodiment of the present invention is not limited to a particular embodiment. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example. Although an example in which an IGZO film is used in the photoelectric conversion element as the hole injection blocking layer over the photoelectric conversion layer is described as one embodiment of the present invention, one embodiment of the present invention is not limited thereto. Depending on circumstances or conditions, the hole injection blocking layer in one embodiment of the present invention may be provided under the photoelectric conversion layer. Depending on circumstances or conditions, the hole injection blocking layer in one embodiment of the present invention may include, for example, at least one of silicon, germanium, silicon germanium, silicon carbide, gallium arsenide, aluminum gallium arsenide, indium phosphide, and gallium nitride. Alternatively, for example, depending on circumstances or conditions, one embodiment of the present invention does not necessarily include a hole injection blocking layer including an IGZO film.

This embodiment can be implemented in an appropriate combination with any of the structures described in the other embodiments.

Embodiment 3

In an imaging device of one embodiment of the present invention, an oxide as typified by an In—Ga—Zn oxide is used for the hole injection blocking layer included in the photoelectric conversion element. In this embodiment, the oxide will be described. Note that the oxide can be used as a semiconductor also for a transistor which is connected to the photoelectric conversion element; thus, its effective properties when the oxide is used for a transistor will also be described.

<Structure of Oxide>

A structure of the oxide is described below.

An oxide is classified into a single crystal oxide and the other, a non-single-crystal oxide. Examples of the non-single-crystal oxide include an oxide having a c-axis aligned crystalline (CAAC) structure, a polycrystalline oxide, an oxide having a nanocrystalline (nc) structure, an amorphous-like (a-like) oxide, and an amorphous oxide.

From another perspective, an oxide is classified into an amorphous oxide and the other, a crystalline oxide. Examples of the crystalline oxide include a single crystal oxide, an oxide having a CAAC structure, a polycrystalline oxide, and an oxide having an nc structure.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide that is not isotropic (e.g., an oxide that has a periodic structure in a microscopic region) cannot be regarded as a completely amorphous oxide semiconductor. In contrast, an a-like structure, which is not isotropic, has an unstable structure that contains a void. Because of its instability, an a-like structure is close to an amorphous oxide in terms of physical properties.

<CAAC Structure>

First, an oxide having a CAAC structure will be described.

A CAAC structure is one of oxide structures having a plurality of c-axis aligned crystal parts (also referred to as pellets).

Figure 15A:
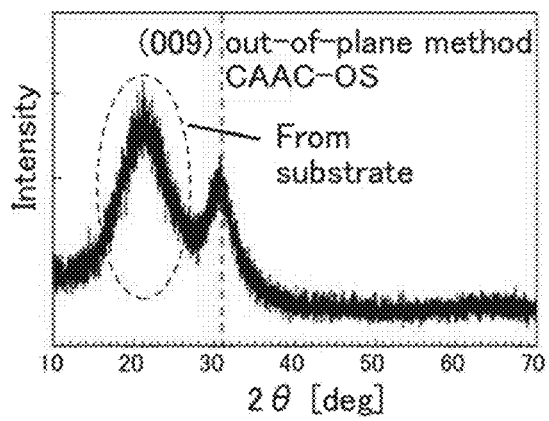
FIGS. 15A to 15E show structural analysis of an oxide having a CAAC structure and a single crystal oxide by XRD and selected-area electron diffraction patterns of an oxide having a CAAC structure.

Analysis of an oxide having a CAAC structure by X-ray diffraction (XRD) will be described. For example, when the oxide having a CAAC structure including an InGaZnO$_4$ crystal that is classified into the space group R-3m is analyzed by an out-of-plane method, a peak appears at a diffraction angle (2θ) of around 31° as shown in FIG. 15A. This peak is derived from the (009) plane of the InGaZnO$_4$ crystal, which indicates that crystals in the oxide having a CAAC structure have c-axis alignment, and that the c-axes are aligned in a direction substantially perpendicular to a surface over which a film of the oxide having a CAAC structure is formed (also referred to as a formation surface) or the top surface. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in an oxide having a CAAC structure.

Figure 15B:
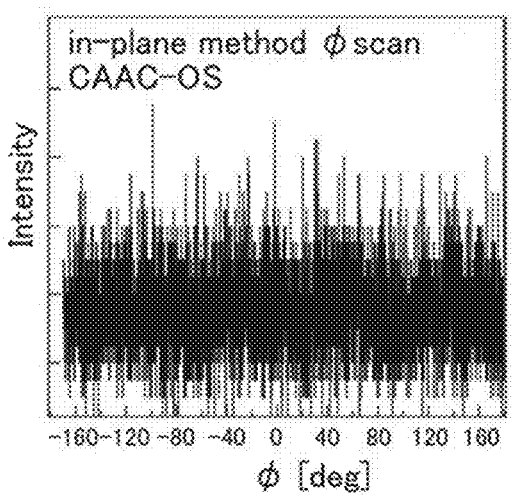
Figure 15C:
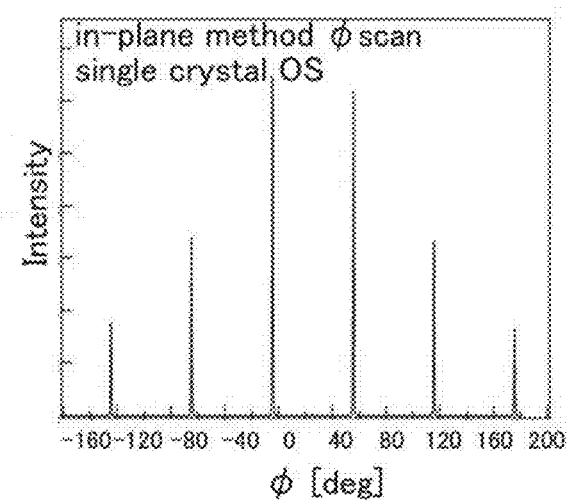

On the other hand, when the structure of the oxide having a CAAC structure is analyzed by an in-plane method in which an X-ray is incident on the oxide having a CAAC structure in the direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), a peak is not clearly observed as shown in FIG. 15B. In contrast, in the case where single crystal InGaZnO$_4$ is subjected to φ scan with 2θ fixed at around 56°, six peaks which are derived from crystal planes equivalent to the (110) plane are observed as shown in FIG. 15C. Accordingly, the structural analysis using XRD shows that the directions of a-axes and b-axes are irregularly oriented in the oxide having a CAAC structure.

Figure 15D:
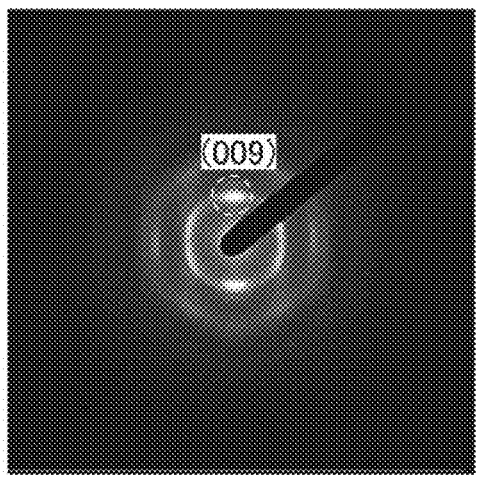
Figure 15E:
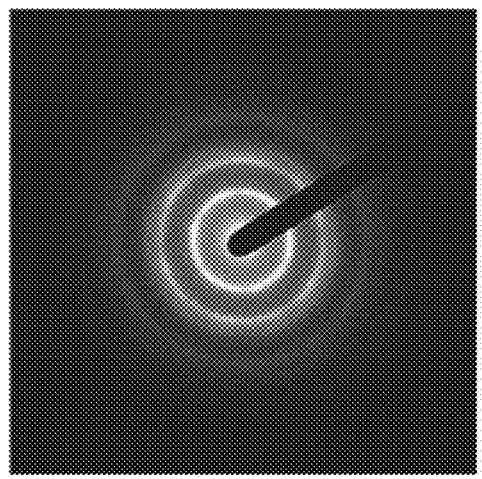

Next, an oxide having a CAAC structure analyzed by electron diffraction will be described. For example, when an electron beam with a probe diameter of 300 nm is incident on an oxide having a CAAC structure including an InGaZnO$_4$ crystal in the direction parallel to the formation surface of the oxide having a CAAC structure, such a diffraction pattern (also referred to as a selected-area electron diffraction pattern) as is shown in FIG. 15D can be obtained. In this diffraction pattern, spots derived from the (009) plane of an InGaZnO$_4$ crystal are included. Thus, the electron diffraction also indicates that pellets included in the oxide having a CAAC structure have c-axis alignment and that the c-axes are aligned in the direction substantially perpendicular to the formation surface or the top surface of the oxide having a CAAC structure. Meanwhile, FIG. 15E shows a diffraction pattern obtained in such a manner that an electron beam with a probe diameter of 300 nm is incident on the same sample in the direction perpendicular to the sample surface. As shown in FIG. 15E, a ring-like diffraction pattern is observed. Thus, the electron diffraction using an electron beam with a probe diameter of 300 nm also indicates that the a-axes and b-axes of the pellets included in the oxide having a CAAC structure do not have regular alignment. The first ring in FIG. 15E is considered to be derived from the (010) plane, the (100) plane, and the like of the InGaZnO$_4$ crystal. The second ring in FIG. 15E is considered to be derived from the (110) plane and the like.

In a combined analysis image (also referred to as a high-resolution TEM image) of a bright-field image and a diffraction pattern of an oxide having a CAAC structure, which is obtained using a transmission electron microscope (TEM), a plurality of pellets can be observed. However, even in the high-resolution TEM image, a boundary between pellets, that is, a grain boundary is not clearly observed in some cases. Thus, a reduction in electron mobility due to the grain boundary is less likely to occur when the oxide is used as a semiconductor.

Figure 16A:
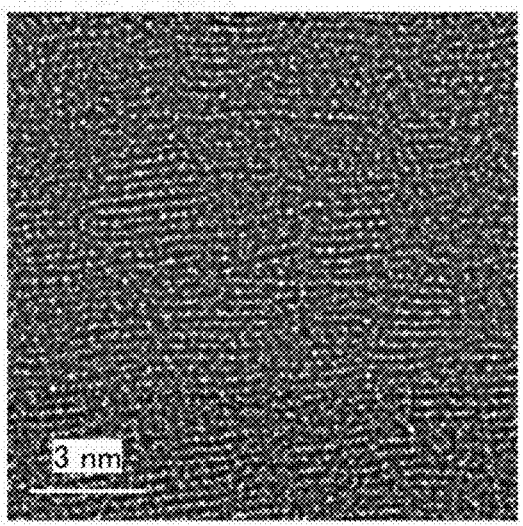
FIGS. 16A to 16E show a cross-sectional TEM image and plan-view TEM images of an oxide having a CAAC structure and images obtained through analysis thereof.

FIG. 16A shows a high-resolution TEM image of a cross section of the oxide having a CAAC structure observed from the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 16A shows pellets in which metal atoms are arranged in a layered manner. FIG. 16A proves that the size of a pellet is greater than or equal to 1 nm or greater than or equal to 3 nm. Therefore, the pellet can also be referred to as a nanocrystal (nc). Furthermore, an oxide having a CAAC structure can also be referred to as an oxide including c-axis aligned nanocrystals (CANC). A pellet reflects unevenness of a formation surface or a top surface of the oxide film, and is parallel to the formation surface or the top surface of the oxide film.

Figure 16B:
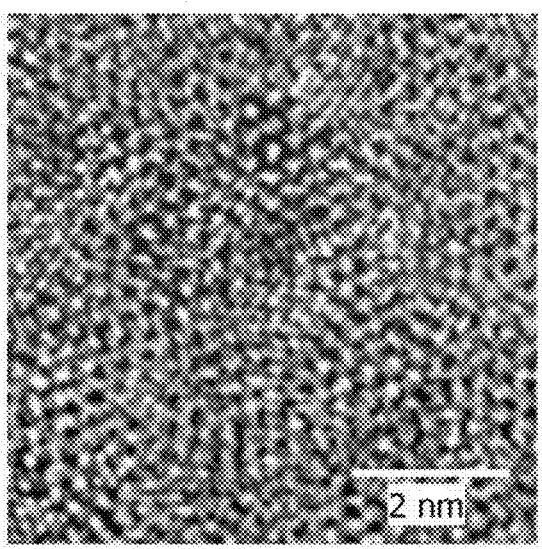
Figure 16C:
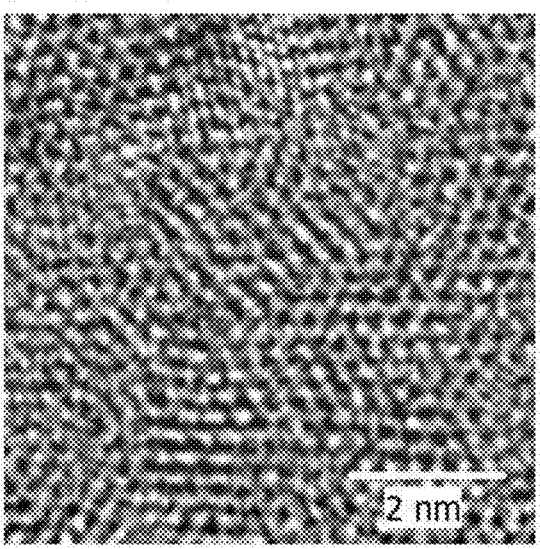
Figure 16D:
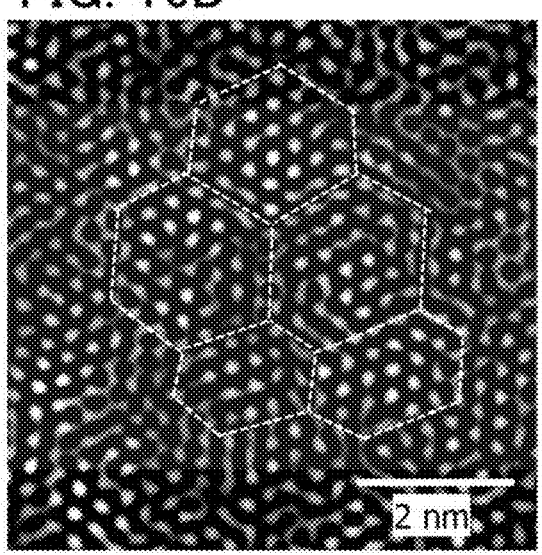
Figure 16E:
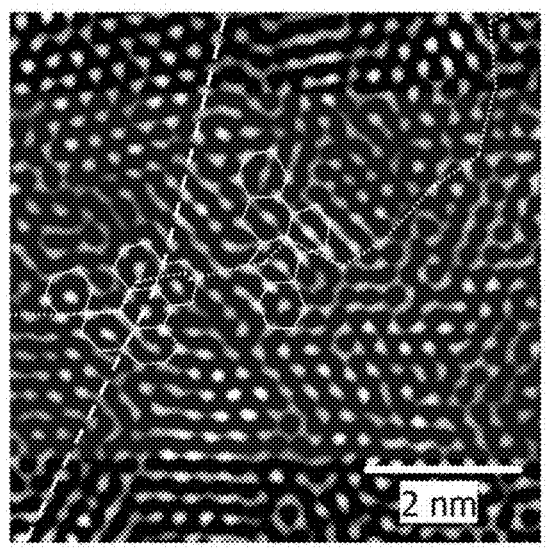

FIGS. 16B and 16C show Cs-corrected high-resolution TEM images of a plane of the oxide having a CAAC structure observed from a direction substantially perpendicular to the sample surface. FIGS. 16D and 16E are images obtained through image processing of FIGS. 16B and 16C. The method of image processing is as follows. The image in FIG. 16B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 16D, a portion where a lattice arrangement is broken is shown by dashed lines. A region surrounded by a dashed line is one pellet. The portion denoted by the dashed lines is a junction of pellets. The dashed line draws a hexagon, which means that the pellet has a hexagonal shape. Note that the shape of the pellet is not always a regular hexagon but is a non-regular hexagon in many cases.

In FIG. 16E, a dotted line denotes a portion where the direction of a lattice arrangement changes between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the oxide having a CAAC structure can tolerate distortion owing to a low density of interatomic bond distance in the a-b plane direction, an interatomic bond distance changed by substitution of a metal element, and the like.

As described above, the oxide having a CAAC structure has c-axis alignment, its pellets (nanocrystals) are connected in the a-b plane direction, and the crystal structure has distortion. For this reason, the oxide having a CAAC structure can also be referred to as an oxide including a c-axis-aligned a-b-plane-anchored (CAA) crystal.

The CAAC structure is a highly crystalline structure. Entry of impurities, formation of defects, or the like might decrease the crystallinity of an oxide. This means that the oxide having a CAAC structure has negligible amounts of impurities and defects (e.g., oxygen vacancies).

Note that, in the case where the oxide is used as a semiconductor, the impurity means an element other than the main components of the oxide, for example, hydrogen, carbon, silicon, and a transition metal element. For example, an element (specifically, silicon or the like) having higher strength of bonding to oxygen than a metal element included in an oxide extracts oxygen from the oxide, which results in disorder of the atomic arrangement and reduced crystallinity of the oxide. A heavy metal such as iron or nickel, argon, carbon dioxide, or the like has a large atomic radius (or molecular radius), and thus disturbs the atomic arrangement of the oxide and decreases crystallinity.

The characteristics of an oxide having impurities or defects which is used as a semiconductor might be changed by light, heat, or the like. For example, the impurity contained in the oxide might serve as a carrier trap or serve as a carrier generation source. For example, oxygen vacancies in the oxide might serve as carrier traps or serve as carrier generation sources when hydrogen is captured therein.

The oxide having a CAAC structure having small amounts of impurities and oxygen vacancies which is used as a semiconductor is an oxide semiconductor with low carrier density. Specifically, an oxide semiconductor with a carrier density of lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$ can be used. Such an oxide semiconductor is referred to as a highly purified intrinsic or substantially highly purified intrinsic oxide semiconductor. A CAAC oxide semiconductor (OS) has a low impurity concentration and a low density of defect states. Thus, the CAAC-OS can be referred to as an oxide semiconductor having stable characteristics.

<Nc Structure>

An oxide having an nc structure will be described below.

Analysis of an oxide having an nc structure by XRD will be described. When the structure of an oxide having an nc structure is analyzed by an out-of-plane method, for example, a peak indicating orientation does not appear. That is, a crystal of an oxide having an nc structure does not have orientation.

Figure 17A:
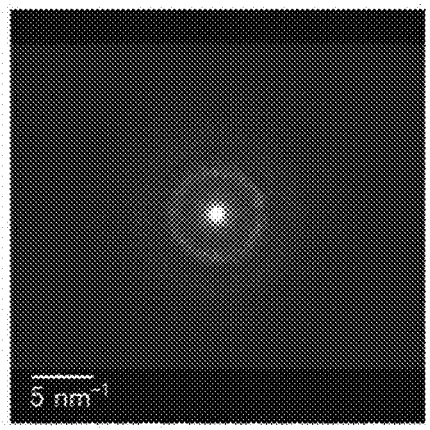
FIGS. 17A to 17D show electron diffraction patterns and a cross-sectional TEM image of an oxide having an nc structure.
Figure 17B:
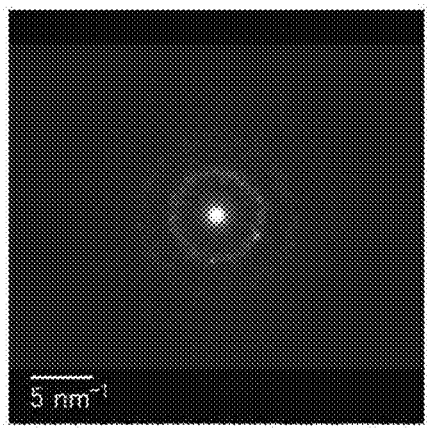

For example, when an electron beam with a probe diameter of 50 nm is incident on a 34-nm-thick region of thinned oxide having an nc structure including an InGaZnO$_4$ crystal in the direction parallel to the formation surface, a ring-shaped diffraction pattern (a nanobeam electron diffraction pattern) shown in FIG. 17A is observed. FIG. 17B shows a diffraction pattern obtained when an electron beam with a probe diameter of 1 nm is incident on the same sample. As shown in FIG. 17B, a plurality of spots are observed in a ring-like region. In other words, ordering in an oxide having an nc structure is not observed with an electron beam with a probe diameter of 50 nm but is observed with an electron beam with a probe diameter of 1 nm.

Figure 17C:
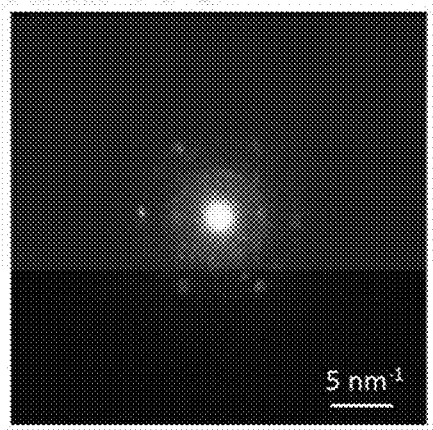

Furthermore, an electron diffraction pattern in which spots are arranged in an approximately hexagonal shape is observed in some cases as shown in FIG. 17C when an electron beam having a probe diameter of 1 nm is incident on a region with a thickness of less than 10 nm. This means that an oxide having an nc structure has a well-ordered region, i.e., a crystal, in the range of less than 10 nm in thickness. Note that an electron diffraction pattern having regularity is not observed in some regions because crystals are aligned in various directions.

Figure 17D:
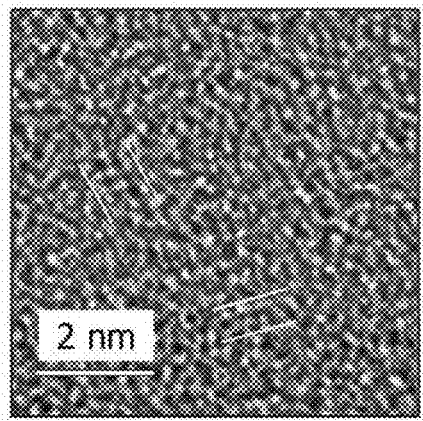

FIG. 17D shows a Cs-corrected high-resolution TEM image of a cross section of an oxide having an nc structure observed from the direction substantially parallel to the formation surface. In a high-resolution TEM image, the oxide has a region in which a crystal part is observed, such as the part indicated by additional lines in FIG. 17D, and a region in which a crystal part is not clearly observed. In most cases, the size of a crystal part included in the oxide is greater than or equal to 1 nm and less than or equal to 10 nm, in particular, greater than or equal to 1 nm and less than or equal to 3 nm. An oxide including a crystal part whose size is greater than 10 nm and less than or equal to 100 nm can be referred to as a microcrystalline oxide. In a high-resolution TEM image of the oxide having an nc structure, for example, a grain boundary is not clearly observed in some cases. Note that there is a possibility that the origin of the nanocrystal is the same as that of a pellet in an oxide having a CAAC structure. Therefore, a crystal part of the oxide having an nc structure may be referred to as a pellet in the following description.

As described above, in the oxide having an nc structure, a microscopic region (for example, a region with a size greater than or equal to 1 nm and less than or equal to 10 nm, in particular, a region with a size greater than or equal to 1 nm and less than or equal to 3 nm) has periodic atomic arrangement. There is no regularity of crystal orientation between different pellets in the oxide having an nc structure. Thus, the orientation of the whole film is not ordered. Accordingly, the oxide having an nc structure cannot be distinguished from an oxide having an a-like structure or an amorphous oxide, depending on analysis methods.

Since there is no regularity of crystal orientation between the pellets (nanocrystals), the oxide having an nc structure can also be referred to as an oxide including random aligned nanocrystals (RANC) or an oxide including non-aligned nanocrystals (NANC).

The oxide having an nc structure is an oxide that has high regularity as compared with an amorphous oxide. Therefore, the oxide having an nc structure is likely to have a lower density of defect states than an oxide having an a-like structure and an amorphous oxide. Note that there is no regularity of crystal orientation between different pellets in the oxide having an nc structure. Therefore, the oxide having an nc structure has a higher density of defect states than the oxide having a CAAC structure.

<Oxide Having a-Like Structure>

An oxide having an a-like structure has a structure between those of the oxide having an nc structure and the amorphous oxide.

Figure 18A:
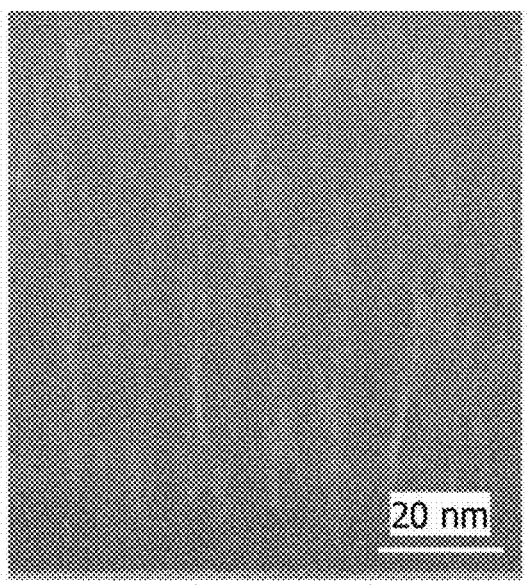
FIGS. 18A and 18B show cross-sectional TEM images of an oxide having an a-like structure.
Figure 18B:
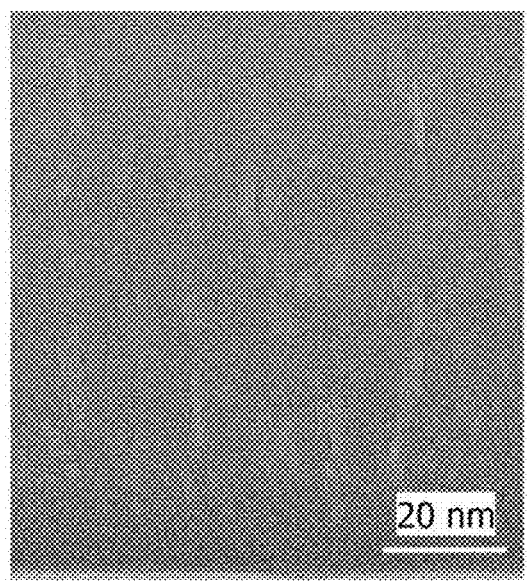

FIGS. 18A and 18B are high-resolution cross-sectional TEM images of an oxide having an a-like structure. FIG. 18A is the high-resolution cross-sectional TEM image of the oxide having an a-like structure at the start of the electron irradiation. FIG. 18B is the high-resolution cross-sectional TEM image of the oxide having an a-like structure after the electron (e) irradiation at $4.3 \times 10^8$ $e^-/nm^2$. FIGS. 18A and 18B show that stripe-like bright regions extending vertically are observed in the oxide having an a-like structure from the start of the electron irradiation. It can also be found that the shape of the bright region changes after the electron irradiation. Note that the bright region is presumably a void or a low-density region.

The oxide having an a-like structure has an unstable structure because it contains a void. To verify that an oxide having an a-like structure has an unstable structure as compared with an oxide having a CAAC structure and an oxide having an nc structure, a change in structure caused by electron irradiation will be described below.

An oxide having an a-like structure, an oxide having an nc structure, and an oxide having a CAAC structure are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing of (009) plane (also referred to as d value). The value is calculated to be 0.29 nm from crystal structural analysis. Accordingly, a portion where the distance between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 19:
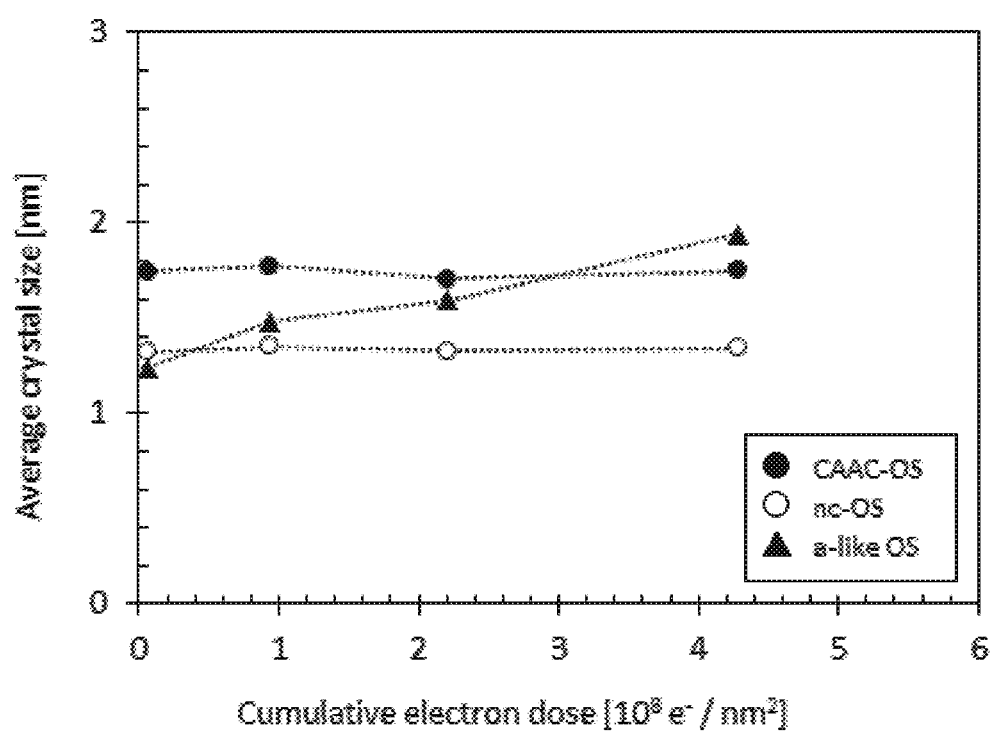
FIG. 19 shows a change in crystal part of an In—Ga—Zn oxide induced by electron irradiation.

FIG. 19 shows change in the average size of crystal parts (at 22 points to 30 points) in each sample. Note that the crystal part size corresponds to the length of a lattice fringe. FIG. 19 indicates that the crystal part size in the oxide having an a-like structure increases with an increase in the cumulative electron dose in obtaining TEM images, for example. As shown in FIG. 19, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the oxide having an nc structure and the oxide having a CAAC structure shows little change from the start of electron irradiation to a cumulative electron dose of $4.2 \times 10^8$ $e^-/nm^2$. As shown in FIG. 19, the size of crystal parts in an oxide having an nc structure and an oxide having a CAAC structure are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiations are as follows: the accelerating voltage is 300 kV; the current density is $6.7 \times 10^5$ $e^-/(nm^2 \times s)$; and the diameter of irradiation region is 230 nm.

In this manner, growth of the crystal part in the oxide having an a-like structure is induced by electron irradiation. In contrast, in the oxide having an nc structure and the oxide having a CAAC structure, growth of the crystal part is hardly induced by electron irradiation. Therefore, the oxide having an a-like structure has an unstable structure as compared with the oxide having an nc structure and the oxide having a CAAC structure.

The oxide having an a-like structure has a lower density than the oxide having an nc structure and the oxide having a CAAC structure because it contains a void. Specifically, the density of the oxide having an a-like structure is higher than or equal to 78.6% and lower than 92.3% of the density of the single crystal oxide having the same composition. The density of each of the oxide having an nc structure and the oxide having a CAAC structure is higher than or equal to 92.3% and lower than 100% of the density of the single crystal oxide having the same composition. It is difficult to deposit an oxide having a density of lower than 78% of the density of the single crystal oxide.

For example, in the case of an oxide having an atomic ratio of In:Ga:Zn=1:1:1, the density of single crystal InGaZnO$_4$ with a rhombohedral crystal structure is 6.357 g/cm$^3$. Accordingly, in the case of the oxide having an atomic ratio of In:Ga:Zn=1:1:1, for example, the density of the oxide having an a-like structure is higher than or equal to 5.0 g/cm$^3$ and lower than 5.9 g/cm$^3$. For example, in the case of the oxide having an atomic ratio of In:Ga:Zn=1:1:1, the density of each of the oxide having an nc structure and the oxide having a CAAC structure is higher than or equal to 5.9 g/cm$^3$ and lower than 6.3 g/cm$^3$.

Note that in the case where an oxide having a certain composition does not exist in a single crystal structure, single crystal oxides with different compositions are combined at an adequate ratio, which makes it possible to calculate density equivalent to that of a single crystal oxide with the desired composition. The density of a single crystal oxide having the desired composition can be calculated using a weighted average according to the combination ratio of the single crystal oxide with different compositions. Note that it is preferable to use as few kinds of single crystal oxides as possible to calculate the density.

As described above, an oxide as typified by an In—Ga—Zn oxide has various structures and various properties. Note that an oxide may be a stack including two or more of an amorphous oxide, an a-like structure, an nc structure, and a CAAC structure, for example.

When a photoelectric conversion layer, which is a formation layer of the hole injection blocking layer, is a crystalline selenium layer, an oxide as typified by an In—Ga—Zn oxide is preferably used for a hole injection blocking layer because the interface between the both layers has a preferable property due to the similar crystallinity of the layers. In addition, when an oxide as typified by an In—Ga—Zn oxide is used for a hole injection blocking layer and an indium tin oxide film or an indium tin oxide film to which silicon is added is used for the second electrode formed thereover, they are well suited to each other because the both are oxide films containing indium and their compositions are close to each other. That is, adhesion between the hole injection blocking layer and the second electrode is improved and the interface has a preferable property.

The structure described in this embodiment can be used in appropriate combination with the structure described in any of the other embodiments.

Embodiment 4

An imaging device of one embodiment of the present invention and a semiconductor device including the imaging device can be used for display devices, personal computers, or image reproducing devices provided with recording media (typically, devices that reproduce the content of recording media such as digital versatile discs (DVD) and have displays for displaying the reproduced images). Furthermore, as electronic devices that can include the imaging device of one embodiment of the present invention and the semiconductor device including the imaging device, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 20A to 20F illustrate specific examples of these electronic devices.

Figure 20A:
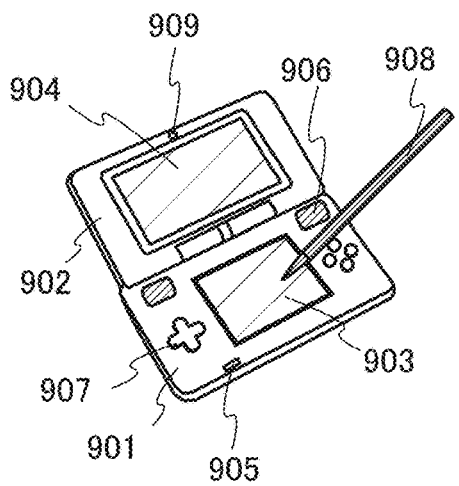
FIGS. 20A to 20F illustrate electronic devices.

FIG. 20A illustrates a portable game machine, which includes housings 901 and 902, display portions 903 and 904, a microphone 905, speakers 906, an operation key 907, a stylus 908, a camera 909, and the like. Although the portable game machine in FIG. 20A includes the two display portions 903 and 904, the number of display portions included in the portable game machine is not limited to this. The imaging device of one embodiment of the present invention can be used for the camera 909.

Figure 20B:
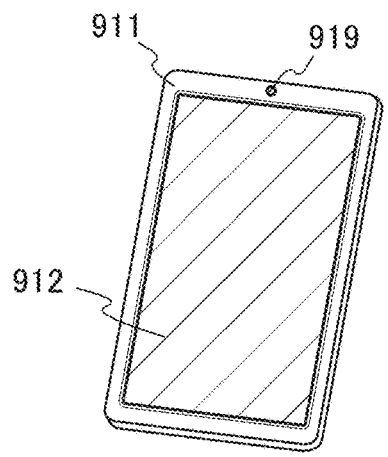

FIG. 20B illustrates a portable data terminal, which includes a first housing 911, a display portion 912, a camera 919, and the like. The touch panel function of the display portion 912 enables input and output of information. The imaging device of one embodiment of the present invention can be used for the camera 919.

Figure 20C:
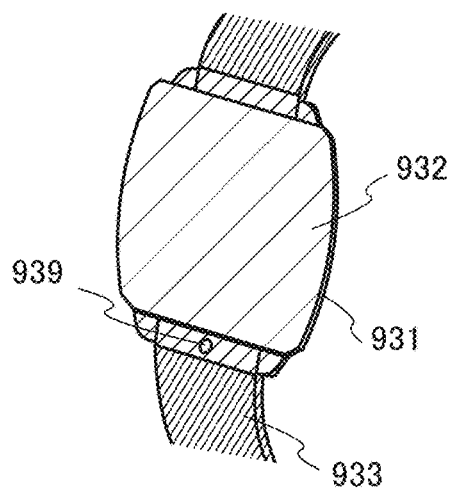

FIG. 20C illustrates a wrist-watch-type information terminal, which includes a housing 931, a display portion 932, a wristband 933, a camera 939, and the like. The display portion 932 may be a touch panel. The imaging device of one embodiment of the present invention can be used for the camera 939.

Figure 20D:
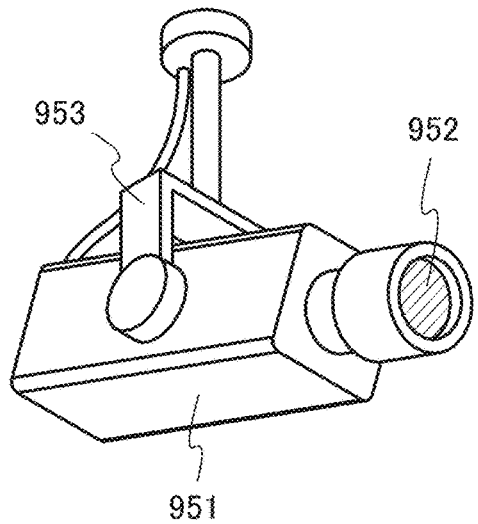

FIG. 20D illustrates a monitoring camera, which includes a housing 951, a lens 952, a support portion 953, and the like. The imaging device of one embodiment of the present invention can be provided in a focus position of the lens 952.

Figure 20E:
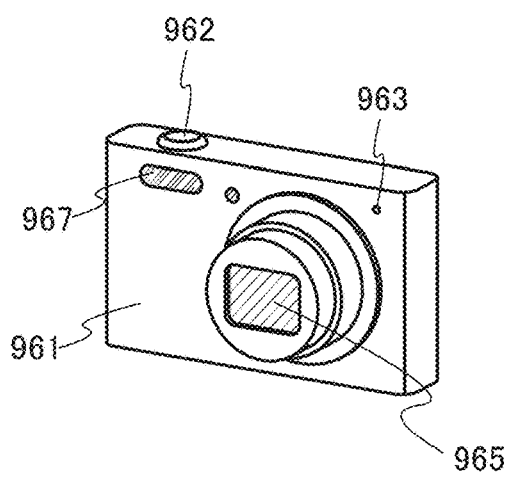

FIG. 20E illustrates a digital camera, which includes a housing 961, a shutter button 962, a microphone 963, a light-emitting portion 967, a lens 965, and the like. The imaging device of one embodiment of the present invention can be provided in a focus position of the lens 965.

Figure 20F:
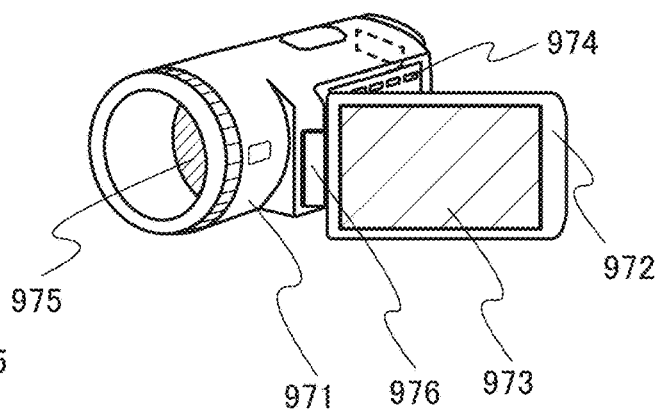

FIG. 20F illustrates a video camera, which includes a first housing 971, a second housing 972, a display portion 973, operation keys 974, a lens 975, a joint 976, and the like. The operation keys 974 and the lens 975 are provided in the first housing 971, and the display portion 973 is provided in the second housing 972. The first housing 971 and the second housing 972 are connected to each other with the joint 976, and an angle between the first housing 971 and the second housing 972 can be changed with the joint 976. An image displayed on the display portion 973 may be switched in accordance with the angle between the first housing 971 and the second housing 972 at the joint 976. The imaging device of one embodiment of the present invention can be provided in a focus of the lens 975.

This embodiment can be combined with any of the other embodiments in this specification as appropriate.

This application is based on Japanese Patent Application serial No. 2015-099011 filed with Japan Patent Office on May 14, 2015, the entire contents of which are hereby incorporated by reference.

What is claimed is:

1. A photoelectric conversion element, comprising:
a first electrode;
a second electrode;

a first layer positioned between the first electrode and the second electrode;
a second layer positioned between the first layer and the second electrode; and
a third layer positioned between the first layer and the first electrode,
wherein the first layer comprises selenium,
wherein the second layer comprises In, Ga, Zn, and O,
wherein the second layer comprises an In-Ga—Zn oxide having a c-axis aligned crystal, and
wherein the selenium is a crystalline selenium.

2. The photoelectric conversion element according to claim 1,
wherein the first layer serves as a photoelectric conversion layer,
wherein the second layer serves as a hole injection blocking layer, and
wherein a crystal grain size of the selenium is smaller than a pixel pitch.

3. The photoelectric conversion element according to claim 1, wherein the third layer serves as an electron injection blocking layer.

4. The photoelectric conversion element according to claim 3, wherein the third layer comprises nickel oxide or antimony sulfide.

5. The photoelectric conversion element according to claim 1,
wherein the second electrode comprises In, Sn, and O, and
wherein a size of a pixel is 3 μm×3 μm square.

6. An imaging device comprising:
a photoelectric conversion element; and
a driver transistor,
wherein the photoelectric conversion element comprises:
a first electrode;
a second electrode;
a first layer positioned between the first electrode and the second electrode;
a second layer positioned between the first layer and the second electrode; and
a third layer positioned between the first layer and the first electrode,
wherein the driver transistor is electrically connected to the photoelectric conversion element,
wherein the first layer comprises selenium,
wherein the second layer comprises In, Ga, Zn, and O,
wherein the second layer comprises an In-Ga—Zn oxide having a c-axis aligned crystal, and
wherein the selenium is a crystalline selenium.

7. The imaging device according to claim 6, further comprising:
a microlens array or a diffraction grating; and
a color filter,
wherein the photoelectric conversion element is capable of receiving light passing through the microlens array or the diffraction grating and the color filter.

8. The imaging device according to claim 6, wherein the driver transistor comprises an oxide semiconductor.

9. The imaging device according to claim 6, further comprising a plurality of photoelectric conversion elements,
wherein a number of the plurality of photoelectric conversion elements is larger than or equal to a number of photoelectric conversion elements used for shooting 8K resolution images, and
wherein a video signal with 8K resolution can be produced.

10. A photoelectric conversion element, comprising:
a first electrode over a substrate;
a first layer over the first electrode;
a second layer over the first layer;
a second electrode over the second layer; and
a third layer positioned between the first layer and the first electrode,
wherein the first layer comprises selenium,
wherein the second layer comprises In, Ga, Zn, and O,
wherein the second layer comprises an In-Ga—Zn oxide having a c-axis aligned crystal, and
wherein the selenium is a crystalline selenium.

11. The photoelectric conversion element according to claim 10,
wherein the first layer serves as a photoelectric conversion layer,
wherein the second layer serves as a hole injection blocking layer, and
wherein a crystal grain size of the selenium is smaller than a pixel pitch.

12. The photoelectric conversion element according to claim 10, wherein the third layer serves as an electron injection blocking layer.

13. The photoelectric conversion element according to claim 12, wherein the third layer comprises nickel oxide or antimony sulfide.

14. The photoelectric conversion element according to claim 10,
wherein the second electrode comprises In, Sn, and O, and
wherein a size of a pixel is 3 μm×3 μm square.

15. An imaging device comprising:
a photoelectric conversion element; and
a driver transistor,
wherein the photoelectric conversion element comprises:
a first electrode over a substrate;
a first layer over the first electrode;
a second layer over the first layer;
a second electrode over the second layer; and
a third layer positioned between the first layer and the first electrode,
wherein the driver transistor is electrically connected to the photoelectric conversion element,
wherein the first layer comprises selenium,
wherein the second layer comprises In, Ga, Zn, and O,
wherein the second layer comprises an In-Ga—Zn oxide having a c-axis aligned crystal, and
wherein the selenium is a crystalline selenium.

16. The imaging device according to claim 15, further comprising:
a microlens array or a diffraction grating; and
a color filter,
wherein the photoelectric conversion element is capable of receiving light passing through the microlens array or the diffraction grating and the color filter.

17. The imaging device according to claim 15, wherein the driver transistor comprises an oxide semiconductor.

18. The imaging device according to claim 15, further comprising a plurality of photoelectric conversion elements,
wherein a number of the plurality of photoelectric conversion elements is larger than or equal to a number of photoelectric conversion elements used for shooting 8K resolution images, and
wherein a video signal with 8K resolution can be produced.

* * * * *